(12) United States Patent
Kamiyama et al.

(10) Patent No.: US 11,462,659 B2
(45) Date of Patent: Oct. 4, 2022

(54) SEMICONDUCTOR LIGHT EMITTING DEVICE AND MANUFACTURING METHOD OF SEMICONDUCTOR LIGHT EMITTING DEVICE

(71) Applicants: KOITO MANUFACTURING CO., LTD., Tokyo (JP); MEIJO UNIVERSITY, Nagoya (JP); TOYODA GOSEI CO., LTD., Kiyosu (JP)

(72) Inventors: Satoshi Kamiyama, Nagoya (JP); Tetsuya Takeuchi, Nagoya (JP); Motoaki Iwaya, Nagoya (JP); Isamu Akasaki, Nagoya (JP); Lu Weifang, Nagoya (JP); Naoki Sone, Shizuoka (JP); Kazuyoshi Iida, Kiyosu (JP); Ryo Nakamura, Kiyosu (JP); Masaki Oya, Kiyosu (JP)

(73) Assignees: KOITO MANUFACTURING CO., LTD., Tokyo (JP); MEIJO UNIVERSITY, Aichi (JP); TOYODA GOSEI CO., LTD., Kiyosu (JP)

( * ) Notice: Subject to any disclaimer, the term of this patent is extended or adjusted under 35 U.S.C. 154(b) by 29 days.

(21) Appl. No.: 17/015,732

(22) Filed: Sep. 9, 2020

(65) Prior Publication Data

US 2021/0074877 A1  Mar. 11, 2021

(30) Foreign Application Priority Data

Sep. 10, 2019 (JP) .............................. JP2019-164083
Oct. 3, 2019 (JP) .............................. JP2019-182829

(51) Int. Cl.
H01L 33/20 (2010.01)
H01L 33/56 (2010.01)
(Continued)

(52) U.S. Cl.
CPC ...... *H01L 33/0093* (2020.05); *H01L 33/0008* (2013.01); *H01L 33/04* (2013.01); *H01L 33/20* (2013.01); *H01L 33/56* (2013.01)

(58) Field of Classification Search
CPC . H01L 33/0093; H01L 33/0008; H01L 33/04; H01L 33/20; H01L 33/56
See application file for complete search history.

(56) References Cited

U.S. PATENT DOCUMENTS 9,972,750 B2 * 5/2018 Herner .................. H01L 33/42
2013/0187128 A1 * 7/2013 Yi ........................ H01L 33/34
438/47

(Continued)

FOREIGN PATENT DOCUMENTS

JP   2015-508941 A   3/2015
JP   2016-518703 A   6/2016
JP   2019-012744 A   1/2019

*Primary Examiner* — Mark W Tornow
(74) *Attorney, Agent, or Firm* — Sughrue Mion, PLLC

(57) ABSTRACT

Provided is a semiconductor light emitting device including a growth substrate; a pillar-shaped semiconductor layer formed on the growth substrate; and a buried semiconductor layer formed to cover the pillar-shaped semiconductor layer, wherein the pillar-shaped semiconductor layer has an n-type nanowire layer formed at a center, an active layer formed on an outermore side than the n-type nanowire layer, a p-type semiconductor layer formed on an outermore side than the active layer and a tunnel junction layer formed on an outermore side than the p-type semiconductor layer, and wherein at least a part of the pillar-shaped semiconductor layer is provided with a removed region formed by removing from the buried semiconductor layer to a part of the tunnel junction layer.

18 Claims, 10 Drawing Sheets

(51) Int. Cl.
*H01L 33/04* (2010.01)
*H01L 33/00* (2010.01)

(56) References Cited

U.S. PATENT DOCUMENTS

| | | | | |
|---|---|---|---|---|
| 2014/0361244 | A1* | 12/2014 | Svensson | H01L 33/24 |
| | | | | 438/34 |
| 2015/0021636 | A1 | 1/2015 | Mandl et al. | |
| 2015/0207028 | A1* | 7/2015 | Romano | H01L 33/06 |
| | | | | 438/39 |
| 2015/0214429 | A1* | 7/2015 | Iizuka | H01L 33/007 |
| | | | | 438/47 |
| 2016/0020364 | A1 | 1/2016 | Herner | |
| 2019/0319066 | A1* | 10/2019 | Tan | H01L 33/08 |

* cited by examiner

300

400

SEMICONDUCTOR LIGHT EMITTING DEVICE AND MANUFACTURING METHOD OF SEMICONDUCTOR LIGHT EMITTING DEVICE

CROSS-REFERENCE TO RELATED APPLICATIONS

The present application claims the benefit of priority of Japanese Patent Application No. 2019-164083, filed on Sep. 10, 2019, and Japanese Patent Application No. 2019-182829, filed on Oct. 3, 2019, the disclosures of which are incorporated herein by reference.

TECHNICAL FIELD

The present invention relates to a semiconductor light emitting device and a manufacturing method of a semiconductor light emitting device.

BACKGROUND ART

In recent years, a crystal growth method for a nitride-based semiconductor has progressed rapidly, so that high-luminous blue light emitting devices and green light emitting devices using the nitride-based semiconductor are put to practical use. By combining an existing red light emitting device with the blue light emitting device and green light emitting device, all three primary colors of light are prepared, so that a full-color display apparatus can also be implemented. That is, when all the three primary colors of light are mixed, white light can be obtained, so that it is possible to apply the same to an illumination device.

In a semiconductor light emitting device that is used for a light source for illumination, it is preferably to implement high energy conversion efficiency and high light output in a high current density region, and to stabilize light distribution characteristics of emitted light. In order to achieve the problems, JP-A-2016-518703 discloses a semiconductor light emitting device where an n-type nanowire core, an intermediate active layer and a p-type shell are grown on a semiconductor substrate and a transparent conductive film such as ITO is formed on the shell.

JP-A-2019-012744 discloses technology of forming a p-type semiconductor layer and a tunnel junction layer on an outer periphery of an active layer and injecting current from a side surface of a nanowire core by using a buried semiconductor layer as a contact layer, so as to prevent light absorption in a transparent conductive film.

JP-A-2015-508941 discloses technology of providing a cover layer on an outer side of an active layer on a nanowire side surface, thereby improving efficiency of a light emitting device.

SUMMARY OF INVENTION

According to the technology disclosed in JP-A-2016-518703, it is necessary to form the ITO film on the shell for current injection, so that a part of the emitted light from the intermediate active layer is absorbed by the ITO film and the external quantum efficiency is lowered. In particular, since an edge-emitting laser or vertical cavity surface emitting semiconductor laser has a structure where light reciprocates in a cavity, the light absorption in ITO adversely affects laser oscillation.

According to the technology disclosed in JP-A-2019-012744, in order to activate a p-type semiconductor layer included in a pillar-shaped semiconductor layer, after forming the tunnel junction layer, a part of the tunnel junction layer is removed to expose the p-type semiconductor layer and a heat treatment is then performed, so that hydrogen incorporated into the p-type semiconductor layer is released to activate the p-type semiconductor layer.

However, according to the technology disclosed in JP-A-2019-012744, after activating the p-type semiconductor layer, the buried semiconductor layer is subjected to regrowth. Therefore, hydrogen contained in ammonia of a nitrogen raw material gas used for growth of the buried semiconductor layer may be incorporated into the p-type semiconductor layer and a part of the p-type semiconductor layer may be thus inactivated. It is not preferable that a part of the p-type semiconductor layer is inactivated in the semiconductor light emitting device, because the luminous efficiency is reduced and a forward voltage is increased, for example.

Also, the semiconductor light emitting device where the active layer is formed on the outer periphery of the nanowire core, which is disclosed in JP-A-2016-518703, JP-A-2019-012744 and JP-A-2015-508941, has fewer crystal defects and threading dislocations and can obtain higher quality crystals than a device where the active layer is formed on an entire surface of a sapphire substrate. Therefore, it is possible to make an effort the external quantum efficiency at the high current density.

However, the heat that is used to grow the nanowire core on the sapphire substrate by selective growth and to subsequently manufacture the active layer and the p-type semiconductor layer deteriorates a surface of the nanowire and a surface of the active layer. As a result, the crystal quality of the active layer may be lowered to reduce the luminous efficiency.

The present embodiment has been made in view of the above problems, and provides a semiconductor light emitting device and a manufacturing method of a semiconductor light emitting device capable of improving an activation rate of a p-type semiconductor layer in a pillar-shaped semiconductor layer and a semiconductor light emitting device and a manufacturing method of a semiconductor light emitting device capable of further improving a crystal quality of an active layer formed on an outermore side than a nanowire to improve the external quantum efficiency.

In order to achieve the above objects, a semiconductor light emitting device in accordance with an aspect of the present embodiment is a semiconductor light emitting device including a growth substrate; a pillar-shaped semiconductor layer formed on the growth substrate; and a buried semiconductor layer formed to cover the pillar-shaped semiconductor layer, wherein the pillar-shaped semiconductor layer has an n-type nanowire layer formed at a center, an active layer formed on an outermore side than the n-type nanowire layer, a p-type semiconductor layer formed on an outermore side than the active layer and a tunnel junction layer formed on an outermore side than the p-type semiconductor layer, and wherein at least a part of the pillar-shaped semiconductor layer is provided with a removed region formed by removing from the buried semiconductor layer to a part of the tunnel junction layer.

In the semiconductor light emitting device, since the buried semiconductor layer and a part of the tunnel junction layer are removed in the removed region, it is possible to activate the p-type semiconductor layer after growing all the semiconductor layers. Therefore, it is possible to prevent hydrogen from being incorporated during regrowth after activation processing, and to improve an activation rate of the p-type semiconductor layer in the pillar-shaped semiconductor layer.

Also, in the semiconductor light emitting device in accordance with an aspect of the present embodiment, a plurality of the pillar-shaped semiconductor layers is provided, and the removed region is provided over the plurality of pillar-shaped semiconductor layers.

Also, in the semiconductor light emitting device in accordance with an aspect of the present embodiment, the removed region is removed to a part of the p-type semiconductor layer.

Also, in the semiconductor light emitting device in accordance with an aspect of the present embodiment, the removed region is removed to a part of the active layer.

Also, in the semiconductor light emitting device in accordance with an aspect of the present embodiment, the removed region is removed to a part of the n-type nanowire layer.

Also, in the semiconductor light emitting device in accordance with an aspect of the present embodiment, an insulating film is formed on the removed region, and a transparent electrode is formed covering at least a part of the buried semiconductor layer and the removed region.

Also, in the semiconductor light emitting device in accordance with an aspect of the present embodiment, a high-resistance layer is formed on a top part of the n-type nanowire layer.

In order to achieve the above objects, a manufacturing method of a semiconductor light emitting device in accordance with another aspect of the present embodiment includes a mask process of forming a mask layer having an opening portion on a growth substrate; a growth process of forming a pillar-shaped semiconductor layer in the opening portion by using selective growth; and a burying process of growing a buried semiconductor layer on the growth substrate so as to cover the pillar-shaped semiconductor layer, wherein the growth process includes a process of forming an n-type nanowire layer, a process of forming an active layer on an outermore side than the n-type nanowire layer, a process of forming a p-type semiconductor layer on an outermore side than the active layer, and a process of forming a tunnel junction layer on an outermore side than the p-type semiconductor layer, and wherein the manufacturing method includes a removing process of forming at least a part of the pillar-shaped semiconductor layer with a removed region by removing from the buried semiconductor layer to a part of the tunnel junction layer, after the burying process, and an activation process of annealing the p-type semiconductor layer after the removing process.

In the manufacturing method of a semiconductor light emitting device, it is possible to improve an activation rate of the p-type semiconductor layer in the pillar-shaped semiconductor layer.

In order to achieve the above objects, a semiconductor light emitting device in accordance with still another aspect of the present embodiment is a semiconductor light emitting device including a growth substrate, and a pillar-shaped semiconductor layer formed on the growth substrate, wherein the pillar-shaped semiconductor layer has an n-type nanowire layer formed at a center, an active layer formed on an outermore side than the n-type nanowire layer, and a p-type semiconductor layer formed on an outermore side than the active layer, and wherein an inner surface protection layer made of a nitride semiconductor material containing Al is provided on a further n-side than the active layer.

In the semiconductor light emitting device, the inner surface protection layer is provided in contact with the n-type nanowire layer, and the inner surface protection layer consists of the nitride semiconductor material containing Al. Therefore, it is possible to suppress point defects generated in the n-type nanowire layer from propagating to the active layer, thereby improving the crystal quality of the active layer and the external quantum efficiency.

Also, in the semiconductor light emitting device in accordance with still another aspect, the inner surface protection layer is provided covering an outer periphery of the n-type nanowire layer and in contact with the active layer.

Also, in the semiconductor light emitting device in accordance with still another aspect, at least Al is contained in the inner surface protection layer, and a maximum composition ratio of Al is 0.06 mol % or less.

Also, in the semiconductor light emitting device in accordance with still another aspect, a film thickness of the inner surface protection layer is equal to or greater than 1 nm and equal to or smaller than 100 nm.

Also, a semiconductor light emitting device in accordance with still another aspect is a semiconductor light emitting device including a growth substrate, and a pillar-shaped semiconductor layer formed on the growth substrate, wherein the pillar-shaped semiconductor layer has an n-type nanowire layer formed at a center, an active layer formed on an outermore side than the n-type nanowire layer, and a p-type semiconductor layer formed on an outermore side than the active layer, and wherein an outer surface protection layer made of a nitride semiconductor material containing Al is provided covering an outer periphery of the active layer.

Also, a semiconductor light emitting device in accordance with still another aspect is a semiconductor light emitting device including a growth substrate, and a pillar-shaped semiconductor layer formed on the growth substrate, wherein the pillar-shaped semiconductor layer has an n-type nanowire layer formed at a center, an active layer formed on an outermore side than the n-type nanowire layer, and a p-type semiconductor layer formed on an outermore side than the active layer, and wherein an outer surface protection layer made of a nitride semiconductor material containing Al is provided covering an outer periphery of a tunnel junction layer.

Also, in the semiconductor light emitting device in accordance with still another aspect, the inner surface protection layer is provided on a bottom part of the n-type nanowire layer.

Also, the semiconductor light emitting device in accordance with still another aspect further includes a buried semiconductor layer formed to cover the pillar-shaped semiconductor layer.

Also, in the semiconductor light emitting device in accordance with still another aspect, a tunnel junction layer is formed on an outermore side than the p-type semiconductor layer.

In order to achieve the above objects, a manufacturing method of a semiconductor light emitting device in accordance with still another aspect of the present embodiment includes a mask process of forming a mask layer having an opening portion on a growth substrate; and a growth process of forming a pillar-shaped semiconductor layer in the opening portion by using selective growth, wherein the growth process includes a process of forming an n-type nanowire layer, a process of forming an active layer on an outermore side than the n-type nanowire layer, a process of forming an inner surface protection layer in contact with lower sides of the n-type nanowire layer and the active layer, the inner surface protection layer being made of a nitride semiconductor material containing Al, and a process of forming a p-type semiconductor layer on an outermore side than the active layer.

In the manufacturing method of a semiconductor light emitting device, it is possible to further improve the crystal quality of the active layer formed on the outermore side than the nanowire, thereby improving the external quantum efficiency.

BRIEF DESCRIPTION OF DRAWINGS

FIGS. 2A-2E are pictorial views depicting a manufacturing method of the semiconductor light emitting device 10, wherein FIG. 2A depicts a mask forming process, FIG. 2B depicts a nanowire growing process, FIG. 2C depicts a growth process, FIG. 2D depicts a removing process, and FIG. 2E depicts an electrode forming process.

FIGS. 5A-5E are pictorial views depicting a manufacturing method of the semiconductor light emitting device 40, wherein FIG. 5A depicts a mask forming process, FIG. 5B depicts a nanowire growing process, FIG. 5C depicts a growth process, FIG. 5D depicts a removing process, and FIG. 5E depicts an electrode forming process.

FIGS. 8A-8B are pictorial views depicting a semiconductor light emitting device 100 in accordance with a sixth embodiment, in which FIG. 8A depicts the entire semiconductor light emitting device and FIG. 8B depicts an enlarged structure of a pillar-shaped semiconductor layer part.

FIGS. 9A-9E are pictorial views depicting a manufacturing method of the semiconductor light emitting device 100, wherein FIG. 9A depicts a mask forming process, FIG. 9B depicts a nanowire growing process, FIG. 9C depicts a pillar-shaped semiconductor layer growing process, FIG. 9D depicts a removing process, and FIG. 9E depicts an electrode forming process.

FIGS. 10A-10B are graphs showing an emission intensity of the semiconductor light emitting device 100, wherein FIG. 10A shows a relation between a film thickness of an inner surface protection layer 150 and the emission intensity, and FIG. 10B shows a relation between a composition ratio of the inner surface protection layer 150 and the emission intensity.

DESCRIPTION OF EMBODIMENTS

First Embodiment

Figure 1:
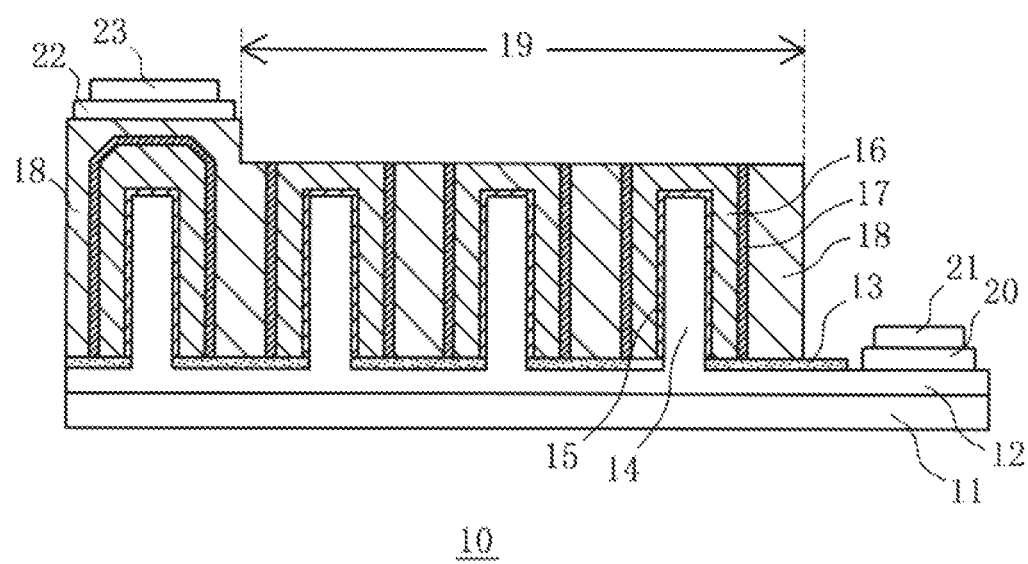
FIG. 1 is a pictorial view depicting a semiconductor light emitting device 10 in accordance with a first embodiment.

Hereinbelow, embodiments of the present embodiment will be described in detail with reference to the drawings. The same or equivalent constitutional elements, members and processing shown in the respective drawings are denoted with the same reference signs, and the overlapping descriptions are omitted as appropriate. FIG. 1 is a pictorial view depicting a semiconductor light emitting device 10 in accordance with a first embodiment.

As shown in FIG. 1, the semiconductor light emitting device 10 includes a growth substrate 11, a foundation layer 12, a mask 13, n-type nanowire layers 14, active layers 15, p-type semiconductor layers 16, tunnel junction layers 17, and a buried semiconductor layer 18. Herein, the n-type nanowire layer 14, the active layer 15, the p-type semiconductor layer 16 and the tunnel junction layer 17 are selectively grown to have a pillar shape in a direction perpendicular to the growth substrate 11, and configure a pillar-shaped semiconductor layer in the present embodiment. The plurality of pillar-shaped semiconductor layers is partially removed from the buried semiconductor layer 18 to parts of the tunnel junction layers 17 and the p-type semiconductor layers 16, so that a removed region 19 is formed.

As shown in FIG. 1, the foundation layer 12 is exposed at a part of the semiconductor light emitting device 10, and cathode electrodes 20 and 21 are formed on the exposed foundation layer 12. Also, the buried semiconductor layer 18 is left in a partial region above the pillar-shaped semiconductor layer, and anode electrodes 22 and 23 are formed on the buried semiconductor layer 18 in the region. As described above, in a region where the anode electrodes 22 and 23 are not formed, the buried semiconductor layer 18 and the tunnel junction layer 17 are removed until the p-type semiconductor layer 16 is partially exposed, so that the removed region 19 is formed. As used herein, the description "the p-type semiconductor layer 16 is exposed" means that the p-type semiconductor layer 16 is exposed after all semiconductor layers configuring the semiconductor light emitting device 10 are formed, and as described later, a passivation film, a transparent electrode, an insulating film and the like may also be formed in a post-process.

The growth substrate 11 is a substantially flat plate-shaped member made of a material capable of crystal-growing a semiconductor material, and the mask 13 is formed on a main surface-side thereof. The growth substrate 11 may be made of a single material or a substrate where a plurality of semiconductor layers such as a buffer layer is grown on a single crystal substrate may also be used. The growth substrate 11 may be a single crystal substrate made of a material for growing a semiconductor single crystal layer via a buffer layer. In a case where the semiconductor light emitting device 10 is configured by a nitride-based semiconductor, a c-plane sapphire substrate is preferable but another dissimilar substrate such as Si is also possible. Also, for laser oscillation, a c-plane GaN substrate where a cavity surface is likely to form by cleavage may be used. The buffer layer is a layer formed between the single crystal substrate and the foundation layer 12 to relax lattice mismatch of the single crystal substrate and the foundation layer. In a case where the c-plane sapphire substrate is used as the single crystal substrate, AlN is preferably used as the material. However, GaN, AlGaN and the like may also be used.

The foundation layer 12 is a single crystal semiconductor layer formed on the growth substrate 11 or the buffer layer, and is preferably formed of non-doped GaN with a thickness of several μm. The foundation layer 12 may be configured by a single layer or a plurality of layers having an n-type semiconductor layer such as an n-type contact layer. The n-type contact layer is a semiconductor layer doped with n-type impurities, and Si-doped n-type $Al_{0.05}Ga_{0.95}N$ may be exemplified. As shown in FIG. 1, a part of the foundation layer 12 is exposed, so that the cathode electrodes 20 and 21 are formed thereon.

The mask 13 is a layer formed on a surface of the foundation layer 12 and made of a dielectric material. As a material for forming the mask 13, a material by which semiconductor crystal growth from the mask 13 is difficult is selected, and, for example, $SiO_2$, SiNx and the like are preferable. The mask 13 is formed with a plurality of opening portions, which will be described later, and semiconductor layers can be grown from the foundation layer 12 exposed partially from the opening portions.

The pillar-shaped semiconductor layer is a semiconductor layer crystal-grown in the opening portion of the mask 13, and is formed by erecting a substantially pillar-shaped semiconductor layer orthogonally to the main surface of the growth substrate 11. The pillar-shaped semiconductor layer is obtained by setting appropriate growth conditions according to a semiconductor material forming the same and performing selective growth in which a specific crystal plane orientation grows. In the example of FIG. 1, since the mask 13 is formed with the plurality of opening portions two-dimensionally and periodically, the pillar-shaped semiconductor layers are also formed two-dimensionally and periodically on the growth substrate 11. Herein, the example where the pillar-shaped semiconductor layers are arranged two-dimensionally and periodically is shown. However, the pillar-shaped semiconductor layer may also be one or a plurality of pillar-shaped semiconductor layers may be formed aperiodically.

The n-type nanowire layer 14 is a pillar-shaped semiconductor layer selectively grown on the foundation layer 12 exposed from the opening portion of the mask 13, and is formed of GaN doped with n-type impurities, for example. When GaN is used as the n-type nanowire layer 14, the n-type nanowire layer 14 selectively grown on the c-plane of the foundation layer 12 has a substantially hexagonal pillar shape where six m-planes are formed as facets. In FIG. 1, it seems that the n-type nanowire layer 14 grows only in the region where the opening portion is formed. However, actually, the crystal growth also proceeds on the mask 13 due to lateral growth, so that a hexagonal pillar enlarged around the opening portion is formed. For example, when the opening portion is formed as a circle having a diameter of about 150 nm, a hexagonal pillar-shaped n-type nanowire layer 14 having a hexagon inscribed in a circle having a diameter of about 240 nm, as a bottom surface, and a height of about 1 to 2 mm can be formed.

The active layer 15 is a semiconductor layer grown on an outermore side than the n-type nanowire layer 14, and a multiple quantum well active layer where a $Ga_{0.85}In_{0.15}N$ quantum well layer having a thickness of 5 nm and a GaN barrier layer having a thickness of 10 nm are overlapped for five periods may be exemplified. Herein, the multiple quantum well active layer is exemplified but a single quantum well structure or a bulk active layer is also possible. Since the active layer 15 is formed on a side surface and an upper surface of the n-type nanowire layer 14, it is possible to secure an area of the active layer 15.

The p-type semiconductor layer 16 is a semiconductor layer grown on an outermore side than the active layer 15, and is formed of GaN doped with p-type impurities, for example. Since the p-type semiconductor layer 16 is formed on a side surface and an upper surface of the active layer 15, a double hetero structure is formed by the n-type nanowire layer 14, the active layer 15 and the p-type semiconductor layer 16, so that it is possible to favorably confine carriers in the active layer 15 and to improve a probability of radiative recombination. In the semiconductor light emitting device 10 of the present embodiment, when forming the removed region 19, the p-type semiconductor layer 16 is partially removed by etching. For this reason, the p-type semiconductor layer 16, which is to grow on the upper surface of the active layer 15, is preferably formed thick so that the etching does not reach the active layer 15.
For example, the p-type semiconductor layer 16 is grown to have a film thickness of 200 nm or greater.

The tunnel junction layer 17 is a semiconductor layer grown on an outermore side than the p-type semiconductor layer 16, and has, for example, a two-layer structure where a p+ layer heavily doped with p-type impurities on an inner side and an n+ layer heavily doped with n-type impurities on an outer side are sequentially grown. The p+ layer is a semiconductor layer heavily doped with p-type impurities, and, for example, GaN having a thickness of 5 nm and Mg concentration of $2 \times 10^{20} cm^{-3}$ may be used. For the n+ layer, for example, GaN having a thickness of 10 nm and Si concentration of $2 \times 10^{20} cm^{-3}$ may be used. Since a tunnel junction is formed by the p+ layer and the n+ layer, the two layers of the p+ layer and the n+ layer configure the tunnel junction layer 17 in the present embodiment.

The buried semiconductor layer 18 is a semiconductor layer formed to cover an upper surface and a side surface of the pillar-shaped semiconductor layer and to reach the mask 13. As shown in FIG. 1, in the region where the anode electrodes 22 and 23 are formed, the buried semiconductor layer 18 also covers the tunnel junction layer 17 above the pillar-shaped semiconductor layer. Above the pillar-shaped semiconductor layer in the removed region 19 where the anode electrodes 22 and 23 are not formed, the buried semiconductor layer 18 and the tunnel junction layer 17 are removed to expose an upper part of the p-type semiconductor layer 16, and the buried semiconductor layer 18 is in contact with the side surface of the tunnel junction layer 17, as shown in FIG. 1.

The removed region 19 is a region removed from the buried semiconductor layer 18 to a part of the tunnel junction layer 17 in at least a part of the pillar-shaped semiconductor layer. In the example shown in FIG. 1, the upper part of the p-type semiconductor layer 16 is also removed, in addition to the tunnel junction layer 17. However, it is sufficient if at least a part of the p-type semiconductor layer 16 is removed. Also, FIG. 1 shows the example where the removed region 19 is collectively formed over the plurality of pillar-shaped semiconductor layers. However, the removed region 19 may also be provided individually for the plurality of pillar-shaped semiconductor layers.

The cathode electrodes 20 and 21 are electrodes formed in the region where the foundation layer 12 is exposed, and have a structure where a metal material that makes ohmic contact with the outermost surface of the foundation layer 12 and a pad electrode are stacked. The anode electrodes 22 and 23 are electrodes formed on a part of the buried semiconductor layer 18, and have a structure where a metal material that makes ohmic contact with the outermost surface of the buried semiconductor layer 18 and a pad electrode are stacked. Also, although not shown in FIG. 1, a well-known structure where the surface of the semiconductor light emitting device 10 is covered with a passivation film as necessary may also be applied. Also, a transparent electrode obtained by extending the anode electrode 22 may be formed on the entire removed region 19.

When lengthening an emission wavelength of the semiconductor light emitting device 10, it is necessary to increase an InN mole fraction of the active layer 15. For example, when a diameter of a circumscribed circle of the n-type nanowire layer 14 is 300 nm, it is necessary to use a red active layer composition $Ga_{0.6}In_{0.4}N$. However, as the InN mole fraction increases, the compressive stress increases, so that misfit dislocations may be generated. In order to avoid this, a film thickness of the $Ga_{0.6}In_{0.4}AN$ well layer may be reduced or GaInN may be used as the material for forming the n-type nanowire layer 14. Similarly, when shortening the wavelength of the semiconductor light emitting device 10, AlGaN may be used as the n-type nanowire layer 14 or the well layer and the barrier layer of the active layer 15 may be each changed to AlGaN having different compositions.

Figure 2A:
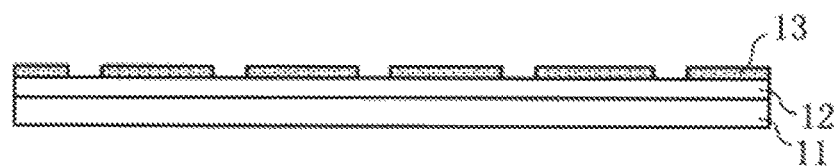
Figure 2B:
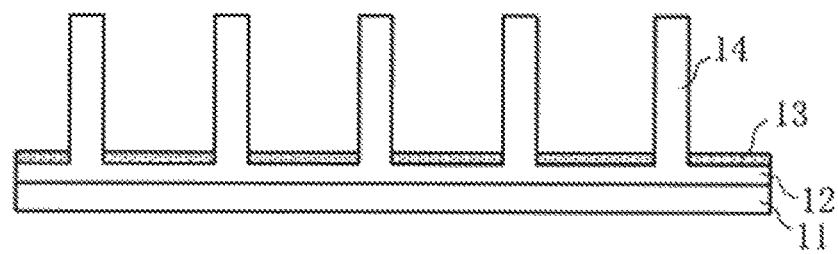
Figure 2C:
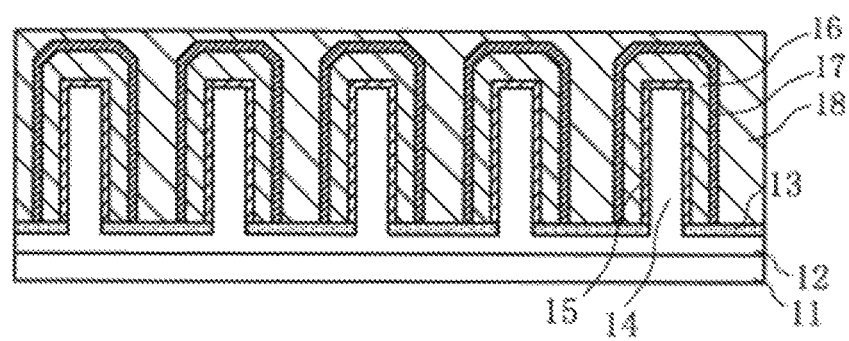
Figure 2D:
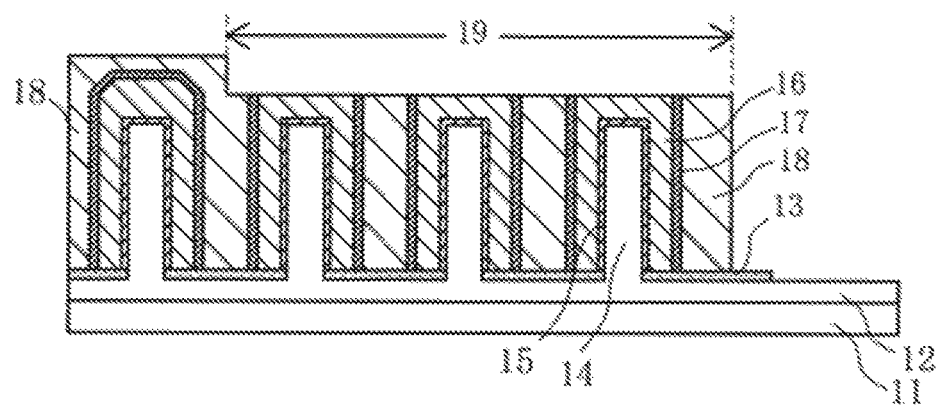
Figure 2E:
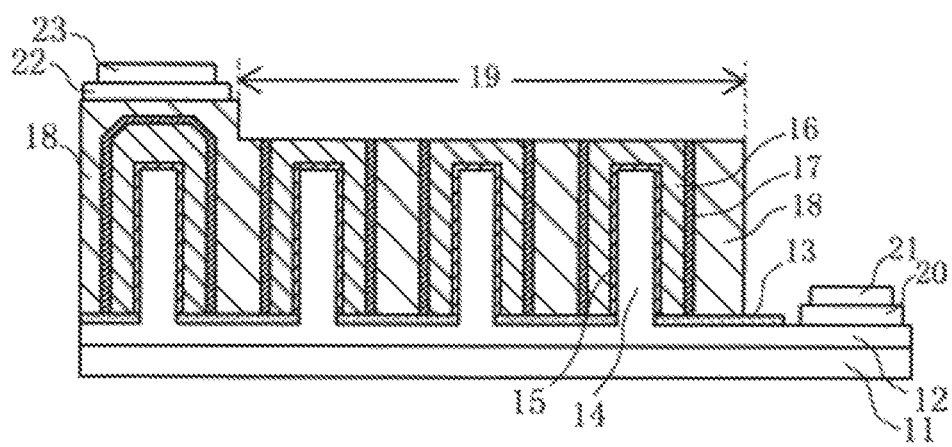

FIGS. 2A-2E are pictorial views depicting a manufacturing method of the semiconductor light emitting device 10, wherein FIG. 2A depicts a mask forming process, FIG. 2B depicts a nanowire growing process, FIG. 2C depicts a growth process, FIG. 2D depicts a removing process, and FIG. 2E depicts an electrode forming process.

In the mask process shown in FIG. 2A, the buffer layer made of AlN and the foundation layer 12 made of GaN and $Al_{0.05}Ga_{0.95}N$ are grown on the growth substrate 11 consisting of sapphire single crystal by using a metal organic chemical vapor deposition (MOCVD) method. Then, the mask 13 made of $SiO_2$ is deposited to have a film thickness of about 30 nm on the foundation layer 12 by a sputtering method, and the opening portions each having a diameter of about 150 nm are formed in the mask by using a fine pattern forming method such as nano-imprinting lithography. As growth conditions of the buffer layer, for example, TMA (TriMethylAluminum), TMG (TriMethylGallium) and ammonia are used as a raw material gas, a growth temperature is 1100° C., a V/III ratio is 100, and a pressure is 10 hPa with hydrogen as a carrier gas. As growth conditions of the foundation layer 12 and the n-type semiconductor layer, for example, the growth temperature is 1050° C., the V/III ratio is 1000, and the pressure is 500 hPa with hydrogen as the carrier gas.

Subsequently, in the nanowire growing process shown in FIG. 2B, the n-type nanowire layers 14 made of GaN are grown on the foundation layer 12 exposed from the opening portions by selective growth of the MOCVD method. As growth conditions of the n-type nanowire layer 14, for example, TMG and ammonia are used as the raw material gas, the growth temperature is 1050° C., the V/III ratio is 10, and the pressure is 100 hPa with hydrogen as the carrier gas.

Subsequently, in the growth process shown in FIG. 2C, the MOCVD method is used to sequentially form the active layer 15 where a $Ga_{0.85}In_{0.15}N$ quantum well layer having a thickness of 5 nm and a GaN barrier layer having a thickness of 10 nm are overlapped for five periods, the p-type semiconductor layer 16 made of GaN doped with p-type impurities, and the tunnel junction layer 17 that includes the p+ layer made of GaN having a thickness of 5 nm and Mg concentration of $2 \times 10^{20} cm^{-3}$ and the n+ layer having a thickness of 10 nm and Si concentration of $2 \times 10^{20} cm^{-3}$, on the side surface and the upper surface of the n-type nanowire layer 14. Subsequently, the buried semiconductor layer 18 made of n-type GaN is grown to bury the outer periphery and the upper surface of the tunnel junction layer 17 in the buried semiconductor layer 18.

As growth conditions of the active layer 15, for example, the growth temperature is 800° C., the V/III ratio is 3000, the pressure is 1000 hPa with nitrogen as the carrier gas, and TMG, TMI (TriMethylIndium) and ammonia are used as the raw material gas. As growth conditions of the p-type semiconductor layer 16, for example, the growth temperature is 950° C., the V/III ratio is 1000, the pressure is 300 hPa with hydrogen as the carrier gas, and TMG, Cp2Mg (bisCycropentadienylMagnesium) and ammonia are used as the raw material gas. As described above, in order to stop the etching in the p-type semiconductor layer 16 when forming the removed region 19, the p-type semiconductor layer 16 is preferably thickened, and the growth condition of the p-type semiconductor layer 16 is also preferably such a condition that the c-plane growth, which is growth in the vertical direction, is promoted. As growth conditions of the tunnel junction layer 17, for example, the growth temperature is 800° C., the V/III ratio is 3000, and the pressure is 500 hPa with nitrogen as the carrier gas.

As described above, it is necessary to grow the buried semiconductor layer 18 on the mask 13 provided between the pillar-shaped semiconductor layers, and when growing the buried semiconductor layer 18, voids may be generated at lower parts of the pillar-shaped semiconductor layers. Therefore, in the growth of the buried semiconductor layer 18, it is preferably to use TMG, silane and ammonia as the raw material gas, and to perform the growth at low temperature and low V/III ratio that promote growth of the m-plane, which is lateral growth, in the early stage. An example of the low temperature and low V/III ratio is 800° C. or lower and the V/III ratio of 100 or smaller, and the pressure of 200 hPa with hydrogen as the carrier gas.

After a space above the mask 13 is buried without any gap at the lower parts of the pillar-shaped semiconductor layers by the lateral growth of the buried semiconductor layer 18, the growth is preferably performed at high temperature and high V/III ratio that promote growth of the c-plane, which is vertical growth. An example of the high temperature and high V/III ratio is 1000° C. or higher and the V/III ratio of 2000 or larger, and the pressure of 500 hPa with hydrogen as the carrier gas.

Subsequently, in the removing process shown in FIG. 2D, the buried semiconductor layer 18, the tunnel junction layer 17 and the p-type semiconductor layer 16 are partially removed selectively by dry etching to expose an upper surface of the p-type semiconductor layer 16, thereby forming the removed region 19. Also, in the region where the cathode electrodes 20 and 21 are to be formed, even the mask 13 is removed to expose an upper surface of the foundation layer 12.

After the removing process, the activation process of performing annealing at 600° C. in an atmospheric environment in the state where the p-type semiconductor layer 16 is exposed, and releasing hydrogen incorporated in the p-type semiconductor layer 16 and the p-type semiconductor layer in the tunnel junction layer 17 to activate the p-type semiconductor layer 16 and the tunnel junction layer 17 is implemented. Herein, the annealing is performed in the atmospheric environment. However, an environment where atomic hydrogen capable of activating the p-type semiconductor layer 16 and the tunnel junction layer 17 does not exist is sufficient.

In the electrode forming process shown in FIG. 2E, the cathode electrodes 20 and 21 are formed on the surface of the foundation layer 12, and the anode electrodes 22 and 23 are formed on the buried semiconductor layer 18. Also, annealing after the electrode formation, formation of a passivation film and device division are implemented, as required, so that the semiconductor light emitting device 10 is obtained.

As described above, in the semiconductor light emitting device 10, after all the semiconductor layers configuring the semiconductor light emitting device 10 are grown, the removed region 19 is formed to expose the p-type semiconductor layer 16, and the activation processing is implemented. Therefore, after the activation processing, it is not necessary to implement regrowth of the semiconductor layer, and it is possible to prevent hydrogen contained in ammonia of the nitrogen raw material gas, which is used for the regrowth, from being incorporated into the p-type semiconductor layer, thereby improving the activation rate of the p-type semiconductor layer in the pillar-shaped semiconductor layer.

Also, in the pillar-shaped semiconductor layer below the region where the anode electrodes 22 and 23 are formed, since the activation processing is implemented in the state where the upper part of the p-type semiconductor layer 16 is covered with the tunnel junction layer 17 and the buried semiconductor layer 18, incorporated hydrogen is difficult to release. Therefore, the p-type semiconductor layer 16 in the pillar-shaped semiconductor layer below the anode electrodes 22 and 23 still has a high resistance, and current injection into the active layer 15 does not occur, so that light is not emitted.

In the semiconductor light emitting device 10 of the present embodiment, when a voltage is applied between the cathode electrodes 20 and 21 and the anode electrodes 22 and 23, current flows in order of the buried semiconductor layer 18, the tunnel junction layer 17, the p-type semiconductor layer 16, the active layer 15, the n-type nanowire layer 14 and the n-type semiconductor layer, so that light is generated by radiative recombination in the active layer 15. The light emitted from the active layer 15 is extracted outside of the semiconductor light emitting device 10.

Also, in the semiconductor light emitting device 10 of the present embodiment, the active layer 15 is formed on the outermore side than the n-type nanowire layer 14, and the tunnel junction layer 17 is formed on the outer periphery of the active layer and is buried in the buried semiconductor layer 18. Therefore, current injected from the anode electrodes 22 and 23 is injected from a sidewall of the p-type semiconductor layer 16 into the active layer 15 via the tunnel junction layer 17 from the buried semiconductor layer 18, as tunneling current. Also, in the upper part of the pillar-shaped semiconductor layer, a reverse bias is applied to the upper surface of the p-type semiconductor layer 16 in contact with the n-type buried semiconductor layer 18, and the buried semiconductor layer 18 is removed in the removed region 19. Therefore, the current injection does not occur in the upper surface of the p-type semiconductor layer 16. The current injection by the tunneling current through the tunnel junction layer 17 has a low resistance, so that it is possible to favorably perform the current injection. Also, the current can diffuse more easily in the buried semiconductor layer 18, which is the n-type semiconductor layer, than the p-type semiconductor layer. Therefore, the current can be favorably diffused to the vicinity of the bottom surface on the side surface of the pillar-shaped semiconductor layer, so that the current can be injected from the entire tunnel junction layer 17.

Thereby, the current injected from the anode electrodes 22 and 23 is favorably injected into the p-type semiconductor layer 16 from the entire side surface of the pillar-shaped semiconductor layer, not the upper surface of the pillar-shaped semiconductor layer, and the current is favorably injected into the active layer 15, so that the high current density is implemented and the external quantum efficiency is improved.

Also, since the side surface of the n-type nanowire layer 14 is the m-plane formed by the selective growth, the active layer 15 and the p-type semiconductor layer 16 formed on the outer periphery of the n-type nanowire layer are also in contact with each other on the m-plane. Since the m-plane is a non-polar plane and polarization does not occur, the luminous efficiency is also high in the active layer 15. Also, since all the side surfaces of the hexagonal pillar are the m-planes, it is possible to improve the luminous efficiency of the semiconductor light emitting device 10. Also, when a height of the pillar-shaped semiconductor layer is increased to 500 nm or greater, a volume of the active layer 15 can be increased by three to ten times, as compared to a semiconductor light emitting device of the related art. As a result, it is possible to reduce an injected carrier density, thereby considerably reducing efficiency droop.

Also, since the buried semiconductor layer 18 is formed of the material whose bandgap is greater than that of the active layer 15, it is possible to remarkably reduce the light absorption in the buried semiconductor layer 18, as compared to a configuration where the current is injected into the pillar-shaped semiconductor layer at ITO or the like. Thereby, the light generated from the active layer 15 is suppressed from being absorbed in the semiconductor light emitting device 10, so that it is possible to improve the external quantum efficiency of extracting light outside of the semiconductor light emitting device 10.

As described above, in the semiconductor light emitting device 10 and the manufacturing method thereof in accordance with the present embodiment, since the buried semiconductor layer 18 and a part of the tunnel junction layer 17 are removed in the removed region 19, it is possible to activate the p-type semiconductor layer 16 after growing all the semiconductor layers. Therefore, it is possible to prevent hydrogen from being incorporated during regrowth after the activation processing, and to improve the activation rate of the p-type semiconductor layer 16 in the pillar-shaped semiconductor layer.

Second Embodiment

Figure 3:
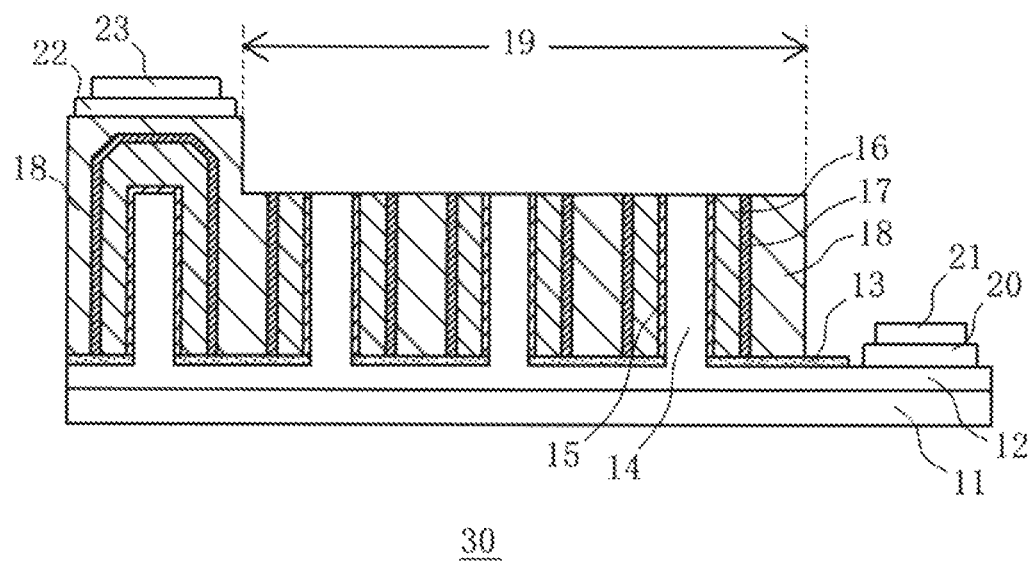
FIG. 3 is a pictorial enlarged view depicting a structure of a pillar-shaped semiconductor layer part of a semiconductor light emitting device 30 in accordance with a second embodiment.

Subsequently, a second embodiment of the present embodiment is described with reference to FIG. 3. The descriptions of the contents overlapping the first embodiment are omitted. FIG. 3 is a pictorial enlarged view depicting a structure of a pillar-shaped semiconductor layer part of a semiconductor light emitting device 30 in accordance with the second embodiment. The present embodiment is different from the first embodiment, in that a part of the active layer 15 is also removed in the removed region 19.

As shown in FIG. 3, the semiconductor light emitting device 30 of the present embodiment also includes the growth substrate 11, the foundation layer 12, the mask 13, the n-type nanowire layers 14, the active layers 15, the p-type semiconductor layers 16, the tunnel junction layers 17, and the buried semiconductor layer 18, and parts of the pillar-shaped semiconductor layers are removed to configure the removed region 19.

In the semiconductor light emitting device 30 of the present embodiment, the removal is made from the buried semiconductor layer 18 to the tunnel junction layer 17, the p-type semiconductor layer 16 and the active layer 15 in the removed region 19, and at least a part of the p-type semiconductor layer 16 is exposed. FIG. 3 shows an example where even the upper surface of the active layer 15 is removed. However, a part of the n-type nanowire layer 14 further below may also be removed.

Also in the present embodiment, since the buried semiconductor layer 18 and a part of the tunnel junction layer 17 are removed in the removed region 19, it is possible to activate the p-type semiconductor layer 16 after growing all the semiconductor layers. Therefore, it is possible to prevent hydrogen from being incorporated during regrowth after the activation processing, and to improve the activation rate of the p-type semiconductor layer 16 in the pillar-shaped semiconductor layer.

Also, since even the active layer 15 formed on the upper surface of the pillar-shaped semiconductor layer is removed, the active layer 15 that contributes to the light emission is only a part provided on the side surface of the pillar-shaped semiconductor layer, and it is possible to enhance the highly efficient light emission on the m-plane.

Third Embodiment

Figure 4:
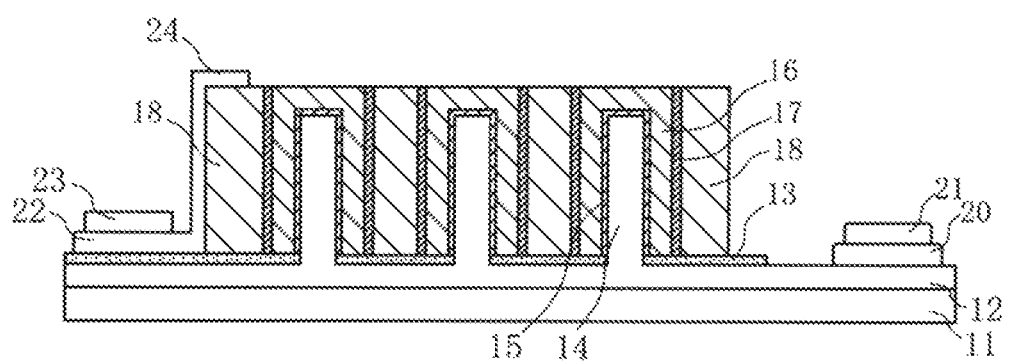
FIG. 4 is a pictorial enlarged view depicting a structure of a pillar-shaped semiconductor layer part of a semiconductor light emitting device 40 in accordance with a third embodiment.

Subsequently, a third embodiment of the present embodiment is described with reference to FIG. 4. The descriptions of the contents overlapping the first embodiment are omitted. FIG. 4 is a pictorial enlarged view depicting a structure of a pillar-shaped semiconductor layer part of a semiconductor light emitting device 40 in accordance with the third embodiment. The present embodiment is different from the first embodiment, in that the pillar-shaped semiconductor layer is not formed in the region where the anode electrodes 22 and 23 are formed.

As shown in FIG. 4, the semiconductor light emitting device 40 of the present embodiment also includes the growth substrate 11, the foundation layer 12, the mask 13, the n-type nanowire layers 14, the active layers 15, the p-type semiconductor layers 16, the tunnel junction layers 17, and the buried semiconductor layer 18, and parts of the pillar-shaped semiconductor layers are removed to configure the removed region 19. In the present embodiment, the anode electrodes 22 and 23 are formed on the mask 13, and a part of the anode electrode 22 extends to the side surface and the upper surface of the buried semiconductor layer 18, so that an extension part 24 is formed.

The extension part 24 is a part formed by extending a part of the anode electrode 22 from the side surface to the upper surface of the buried semiconductor layer 18, and is formed of a metal material that makes ohmic contact with the buried semiconductor layer 18. The extension part 24 is in ohmic contact with the buried semiconductor layer 18, so that the current can be injected from the side surface and the upper surface of the buried semiconductor layer 18. FIG. 4 depicts an example where the extension part 24 is formed only in the region adjacent to the anode electrodes 22 and 23. However, the extension part 24 may also be formed on the entire upper surface of the buried semiconductor layer 18. Also, the extension part 24 may be formed only on the side surface of the buried semiconductor layer 18.

Figure 5A:
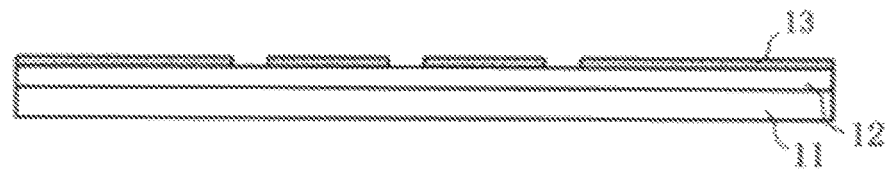
Figure 5B:
Figure 5C:
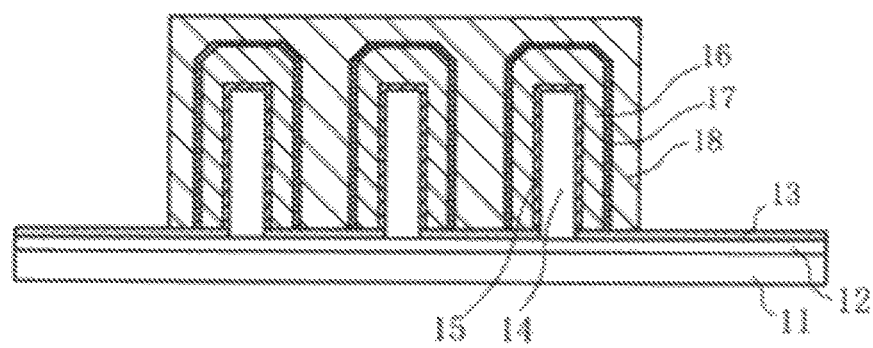
Figure 5D:
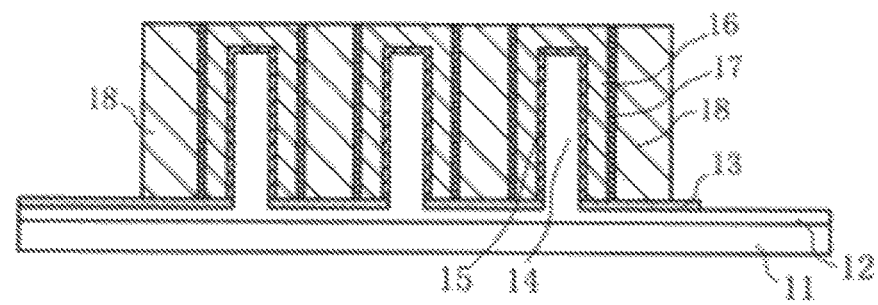
Figure 5E:
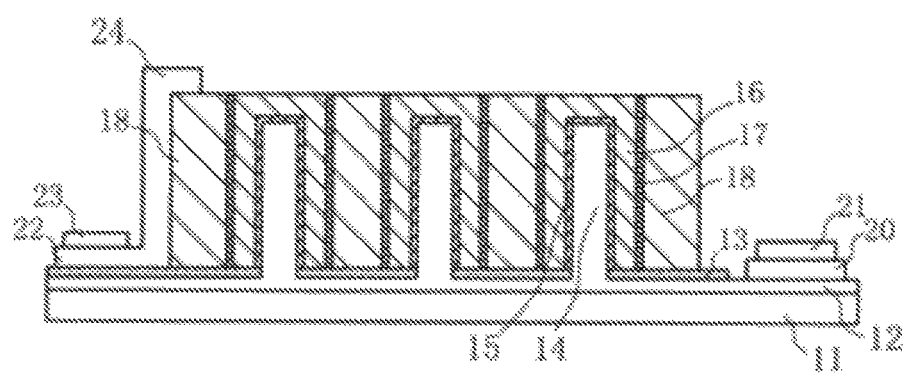

FIGS. 5A-5E are pictorial views depicting a manufacturing method of the semiconductor light emitting device 40, wherein FIG. 5A depicts a mask forming process, FIG. 5B depicts a nanowire growing process, FIG. 5C depicts a growth process, FIG. 5D depicts a removing process, and FIG. 5E depicts an electrode forming process.

In the mask process shown in FIG. 5A, the buffer layer and the foundation layer 12 are grown on the growth substrate 11, the mask 13 made of SiO2 is deposited on the foundation layer 12 by a sputtering method, and the opening portions are formed in the mask by using a fine pattern forming method such as nano-imprinting lithography. At this time, the regions where the cathode electrodes 20 and 21 and the anode electrodes 22 and 23 are to be formed are not formed with the opening portions and are covered with the mask 13.

Subsequently, in the nanowire growing process shown in FIG. 5B, the n-type nanowire layers 14 are grown on the foundation layer 12 exposed from the opening portions. Subsequently, in the growth process shown in FIG. 5C, the active layer 15, the p-type semiconductor layer 16 and the tunnel junction layer 17 are sequentially formed on the side surface and the upper surface of the n-type nanowire layer 14. Subsequently, the buried semiconductor layer 18 is grown to bury the outer periphery and the upper surface of the tunnel junction layer 17 in the buried semiconductor layer 18.

Subsequently, in the removing process shown in FIG. 5D, the buried semiconductor layer 18, the tunnel junction layer 17 and the p-type semiconductor layer 16 are partially removed selectively by dry etching to expose an upper surface of the p-type semiconductor layer 16, thereby forming the removed region 19. Also, in the region where the cathode electrodes 20 and 21 are to be formed, the mask 13 is removed to expose an upper surface of the foundation layer 12. After the removing process, the activation process of performing annealing in the state where the p-type semiconductor layer 16 is exposed, and releasing hydrogen incorporated in the p-type semiconductor layer 16 and the tunnel junction layer 17 to activate the p-type semiconductor layer 16 and the tunnel junction layer 17 is implemented.

In the electrode forming process shown in FIG. 5E, the cathode electrodes 20 and 21 are formed on the surface of the foundation layer 12, and the anode electrodes 22 and 23 are formed on the mask 13. At this time, patterning is performed so that a part of the anode electrode 22 covers the side surface and a part of the upper surface of the buried semiconductor layer 18, thereby forming the extension part 24.

Also in the present embodiment, since the buried semiconductor layer 18 and a part of the tunnel junction layer 17 are removed in the removed region 19, it is possible to activate the p-type semiconductor layer 16 after growing all the semiconductor layers. Therefore, it is possible to prevent hydrogen from being incorporated during regrowth after the activation processing, and to improve the activation rate of the p-type semiconductor layer 16 in the pillar-shaped semiconductor layer.

Also, since the pillar-shaped semiconductor layer is not provided below the anode electrodes 22 and 23, the light emission does not occur in a region where light is shielded by the anode electrodes 22 and 23, and the light emission by the injected current can be efficiently extracted to the outside. Also, since the anode electrodes 22 and 23 are formed in positions lower than the active layer 15, the light emitted from the pillar-shaped semiconductor layer is prevented from being shielded by the anode electrodes 22 and 23, so that the external quantum efficiency can be improved.

Fourth Embodiment

Figure 6:
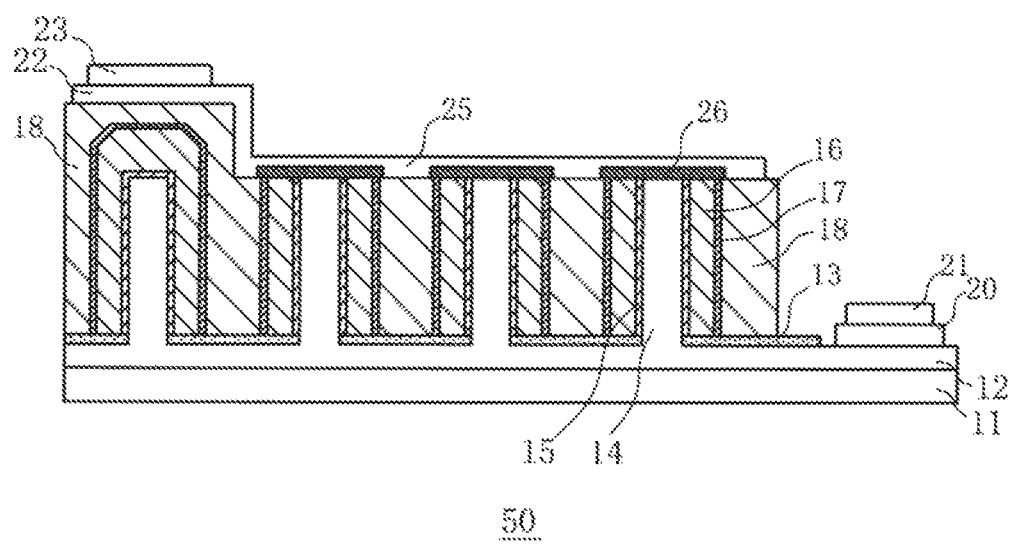
FIG. 6 is a pictorial enlarged view depicting a structure of a pillar-shaped semiconductor layer part of a semiconductor light emitting device 50 in accordance with a fourth embodiment.

Subsequently, a fourth embodiment of the present embodiment is described with reference to FIG. 6. The descriptions of the contents overlapping the first embodiment are omitted. FIG. 6 is a pictorial enlarged view depicting a structure of a pillar-shaped semiconductor layer part of a semiconductor light emitting device 50 in accordance with the fourth embodiment. The present embodiment is different from the first embodiment, in that an insulating film 26 is formed on the pillar-shaped semiconductor layer in the removed region 19 and a transparent electrode 25 is formed covering the insulating film 26 and the buried semiconductor layer 18.

As shown in FIG. 6, the semiconductor light emitting device 50 of the present embodiment includes the growth substrate 11, the foundation layer 12, the mask 13, the n-type nanowire layers 14, the active layers 15, the p-type semiconductor layers 16, the tunnel junction layers 17, and the buried semiconductor layer 18, and parts of the pillar-shaped semiconductor layers are removed to configure the removed region 19. Also, an insulating film 26 is formed on the n-type nanowire layer 14, the active layer 15, the p-type semiconductor layer 16 and the tunnel junction layer 17, which configure the pillar-shaped semiconductor layer in the removed region 19, and a transparent electrode 25 is formed to cover the insulating films 26 and the buried semiconductor layer 18.

The transparent electrode 25 is an electrode that is in ohmic contact with the buried semiconductor layer 18 and allows light emitted from the active layer 15 to penetrate therethrough, and, for example, ITO or metal multilayer film can be used. The transparent electrode 25 is formed by extending a part of the anode electrode 22, and is formed to cover from the buried semiconductor layer 18 in the region where the anode electrodes 22 and 23 are formed to the entire removed region 19 via the side surface of the buried semiconductor layer 18. For formation of the transparent electrode 25, a well-known sputtering method or an EB vapor deposition method may be used.

The insulating film 26 is a layer formed of an insulating material provided on the pillar-shaped semiconductor layer in the removed region 19, and, for example, AlN, $SiO_2$, SiN and the like may be used. The transparent electrode 25 is formed on the insulating film 26. However, since the insulating film 26 is interposed between the transparent electrode 25 and the pillar-shaped semiconductor layer, the current is not injected from the upper surface of the pillar-shaped semiconductor layer.

In the semiconductor light emitting device 50 of the present embodiment, the current supplied from the anode electrodes 22 and 23 is injected not only from the buried semiconductor layer 18 located immediately below the anode electrodes 22 and 23 but also from the buried semiconductor layer 18 in the removed region 19 via the transparent electrode 25. Therefore, it is possible to allow the current to favorably diffuse to the side surface of the pillar-shaped semiconductor layer, thereby injecting the current into the active layers 15 included in the plurality of pillar-shaped semiconductor layers. Also, the insulating film 26 is provided, so that the current injection from the upper surface of the pillar-shaped semiconductor layer into the active layer 15 can be suppressed and the current injection from the side surface can be promoted to improve the luminous efficiency.

Also in the present embodiment, since the buried semiconductor layer 18 and a part of the tunnel junction layer 17 are removed in the removed region 19, it is possible to activate the p-type semiconductor layer 16 after growing all the semiconductor layers. Therefore, it is possible to prevent hydrogen from being incorporated during regrowth after the activation processing, and to improve the activation rate of the p-type semiconductor layer 16 in the pillar-shaped semiconductor layer.

Fifth Embodiment

Figure 7:
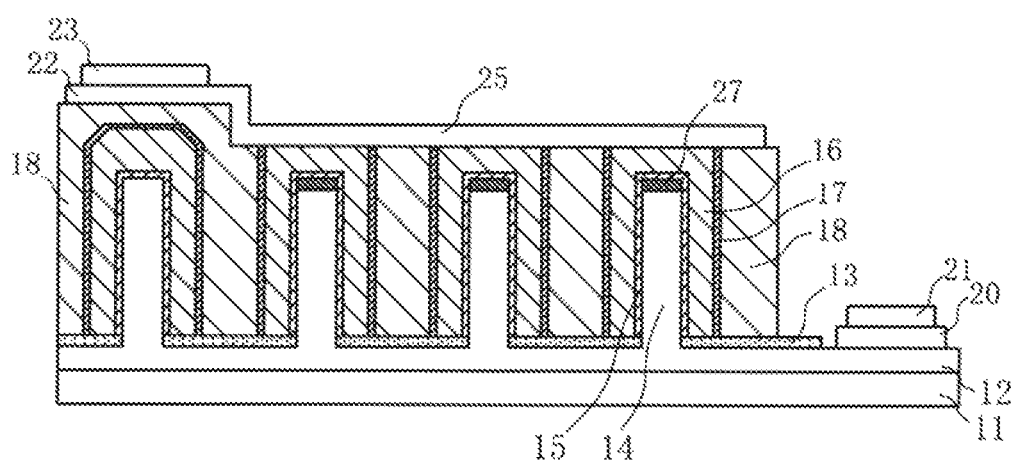
FIG. 7 is a pictorial enlarged view depicting a structure of a pillar-shaped semiconductor layer part of a semiconductor light emitting device 60 in accordance with a fifth embodiment.

Subsequently, a fifth embodiment of the present embodiment is described with reference to FIG. 7. The descriptions of the contents overlapping the first embodiment are omitted. FIG. 7 is a pictorial enlarged view depicting a structure of a pillar-shaped semiconductor layer part of a semiconductor light emitting device 60 in accordance with the fourth embodiment. The present embodiment is different from the first embodiment, in that a high-resistance layer 27 is formed on a top part of the n-type nanowire layer 14.

As shown in FIG. 7, the semiconductor light emitting device 60 of the present embodiment includes the growth substrate 11, the foundation layer 12, the mask 13, the n-type nanowire layers 14, high-resistance layers 27, the active layers 15, the p-type semiconductor layers 16, the tunnel junction layers 17, and the buried semiconductor layer 18, and parts of the pillar-shaped semiconductor layers are removed to configure the removed region 19. Also, the transparent electrode 25 is formed to cover the upper surface of the removed region 19.

The high-resistance layer 27 is a layer provided on a top part of the n-type nanowire layer 14, and is formed of a semiconductor material whose resistance is higher than that of the n-type nanowire layer 14. The semiconductor material for forming the high-resistance layer 27 may have the same or different composition as or from the n-type nanowire layer 14. Also, the high-resistance layer 27 may be a non-doped layer or a layer doped with p-type impurities.

When a semiconductor material having the same composition as the n-type nanowire layer 14 is used as the high-resistance layer 27, the high-resistance layer 27 can be grown by stopping supply of a Si raw material that is a material of n-type impurities or supplying a raw material of Mg that is a material of p-type impurities, at the end of the growth process of the n-type nanowire layer 14.

In the semiconductor light emitting device 60 of the present embodiment, the current supplied from the anode electrodes 22 and 23 is injected not only from the buried semiconductor layer 18 located immediately below the anode electrodes 22 and 23 but also from the buried semiconductor layer 18 in the removed region 19 via the transparent electrode 25. Therefore, it is possible to allow the current to favorably diffuse to the side surface of the pillar-shaped semiconductor layer, thereby injecting the current into the active layers 15 included in the plurality of pillar-shaped semiconductor layers. Also, the high-resistance layer 27 is provided on the top part of the n-type nanowire layer 14, so that the current injection from the upper surface of the pillar-shaped semiconductor layer into the active layer 15 can be suppressed and the current injection from the side surface can be promoted to improve the luminous efficiency.

Also in the present embodiment, since the buried semiconductor layer 18 and a part of the tunnel junction layer 17 are removed in the removed region 19, it is possible to activate the p-type semiconductor layer 16 after growing all the semiconductor layers. Therefore, it is possible to prevent hydrogen from being incorporated during regrowth after the activation processing, and to improve the activation rate of the p-type semiconductor layer 16 in the pillar-shaped semiconductor layer.

Sixth Embodiment

Figure 8A:
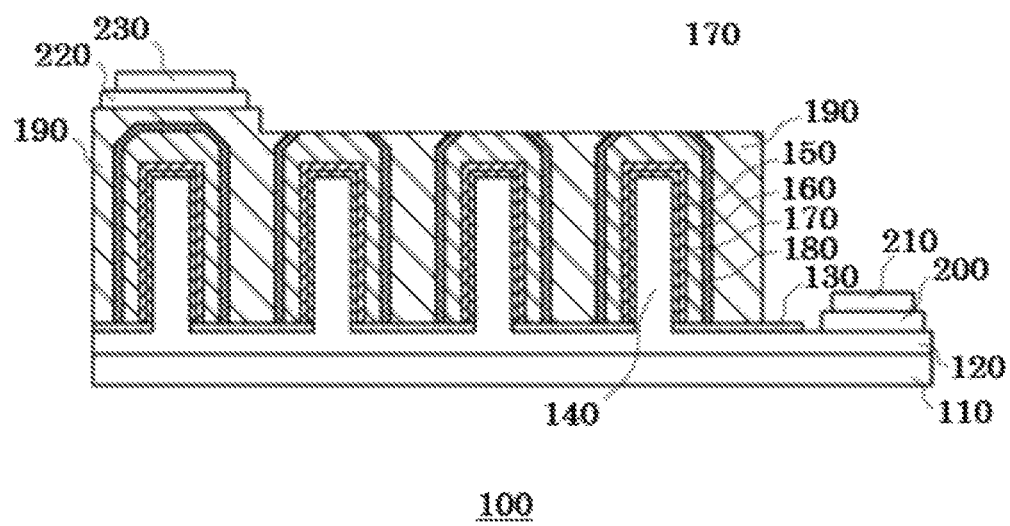
Figure 8B:
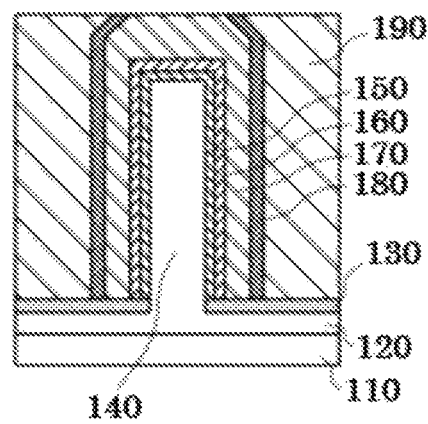

Hereinbelow, embodiments of the present embodiment will be described in detail with reference to the drawings. The same or equivalent constitutional elements, members and processing shown in the respective drawings are denoted with the same reference signs, and the overlapping descriptions are omitted as appropriate. FIGS. 8A-8B are pictorial views depicting a semiconductor light emitting device 100 in accordance with a sixth embodiment, in which FIG. 8A depicts the entire semiconductor light emitting device and FIG. 8B depicts an enlarged structure of a pillar-shaped semiconductor layer part.

As shown in FIGS. 8A and 8B, the semiconductor light emitting device 100 includes a growth substrate 110, a foundation layer 120, a mask 130, n-type nanowire layers 140, inner surface protection layers 150, active layers 160, p-type semiconductor layers 170, tunnel junction layers 180, and a buried semiconductor layer 190. Herein, the n-type nanowire layer 140, the inner surface protection layer 150, the active layer 160, the p-type semiconductor layer 170 and the tunnel junction layer 180 are selectively grown to have a pillar shape in a direction perpendicular to the growth substrate 110, and configure a pillar-shaped semiconductor layer in the present embodiment.

As shown in FIG. 8A, the foundation layer 120 is exposed at a part of the semiconductor light emitting device 100, and cathode electrodes 200 and 210 are formed on the exposed foundation layer 120. Also, the buried semiconductor layer 190 is left in a partial region above the pillar-shaped semiconductor layer, and anode electrodes 220 and 230 are formed on the buried semiconductor layer 190 in the region. In a region where the anode electrodes 220 and 230 are not formed, the buried semiconductor layer 190 and the tunnel junction layer 180 are removed until the p-type semiconductor layer 170 is partially exposed.

The growth substrate 110 is a substantially flat plate-shaped member made of a material capable of crystal-growing a semiconductor material, and the mask 130 is formed on a main surface-side thereof The growth substrate 110 may be made of a single material or a substrate where a plurality of semiconductor layers such as a buffer layer is grown on a single crystal substrate may also be used. The growth substrate 110 may be a single crystal substrate made of a material for growing a semiconductor single crystal layer via a buffer layer. In a case where the semiconductor light emitting device 100 is configured by a nitride-based semiconductor, a c-plane sapphire substrate is preferable but another dissimilar substrate such as Si is also possible. Also, for laser oscillation, a c-plane GaN substrate where a cavity surface is likely to form by cleavage may be used. The buffer layer is a layer formed between the single crystal substrate and the foundation layer 120 to relax lattice mismatch of the single crystal substrate and the foundation layer. In a case where the c-plane sapphire substrate is used as the single crystal substrate, MN is preferably used as the material. However, GaN, AlGaN and the like may also be used.

The foundation layer 120 is a single crystal semiconductor layer formed on the growth substrate 110 or the buffer layer, and is preferably formed of non-doped GaN with a thickness of several μm. The foundation layer 120 may be configured by a single layer or a plurality of layers having an n-type semiconductor layer such as an n-type contact layer. The n-type contact layer is a semiconductor layer doped with n-type impurities, and Si-doped n-type $Al_{0.95}Ga_{0.95}N$ may be exemplified. As shown in FIG. 8A, a part of the foundation layer 120 is exposed, so that the cathode electrodes 200 and 210 are formed thereon.

The mask 130 is a layer formed on a surface of the foundation layer 120 and made of a dielectric material. As a material for forming the mask 130, a material by which semiconductor crystal growth from the mask 13 is difficult is selected, and, for example, $SiO_2$, SiNx and the like are preferable. The mask 130 is formed with a plurality of opening portions, which will be described later, and semiconductor layers can be grown from the foundation layer 12 exposed partially from the opening portions.

The pillar-shaped semiconductor layer is a semiconductor layer crystal-grown in the opening portion of the mask 130, and is formed by erecting a substantially pillar-shaped semiconductor layer orthogonally to the main surface of the growth substrate 11. The pillar-shaped semiconductor layer is obtained by setting appropriate growth conditions according to a semiconductor material forming the same and performing selective growth in which a specific crystal plane orientation grows. In the example of FIGS. 8A-8B, since the mask 130 is formed with the plurality of opening portions two-dimensionally and periodically, the pillar-shaped semiconductor layers are also formed two-dimensionally and periodically on the growth substrate 110. Herein, the example where the pillar-shaped semiconductor layers are arranged two-dimensionally and periodically is shown. However, the pillar-shaped semiconductor layer may also be one or a plurality of pillar-shaped semiconductor layers may be formed aperiodically.

The n-type nanowire layer 140 is a pillar-shaped semiconductor layer selectively grown on the foundation layer 120 exposed from the opening portion of the mask 130, and is formed of GaN doped with n-type impurities, for example. When GaN is used as the n-type nanowire layer 140, the n-type nanowire layer 140 selectively grown on the c-plane of the foundation layer 120 has a substantially hexagonal pillar shape where six m-planes are formed as facets. In FIGS. 8A and 8B, it seems that the n-type nanowire layer 140 grows only in the region where the opening portion is formed. However, actually, the crystal growth also proceeds on the mask 130 due to lateral growth, so that a hexagonal pillar enlarged around the opening portion is formed. For example, when the opening portion is formed as a circle having a diameter of about 150 nm, a hexagonal pillar-shaped n-type nanowire layer 140 having a hexagon inscribed in a circle having a diameter of about 240 nm, as a bottom surface, and a height of about 1 to 2 mm can be formed.

The inner surface protection layer 150 is a semiconductor layer made of a nitride semiconductor material containing Al, and is provided in contact with the n-type nanowire layer 140 and covering an outer periphery thereof. It is known that when Al is contained in a very small amount in a nitride semiconductor layer, point defects generated during crystal growth are more difficult to propagate than in a GaN layer. Therefore, the inner surface protection layer 150 is a layer for suppressing point defects, which are generated during selective growth of a semiconductor layer from the opening portion of the mask 130 onto the foundation layer 120, from propagating to the active layer 160, and is represented by a general formula $Al_yGa_zN$ (y+z=1). The inner surface protection layer 150 may be a non-doped layer or a layer doped with n-type impurities such as Si.

As described later, a composition ratio of the inner surface protection layer 150 is preferably within a range where a value of y in the general formula is larger than 0 and equal to or smaller than 0.06. Also, a film thickness of the inner surface protection layer 150 is preferably 1 nm or larger and 30 nm or smaller, and is more preferably 1 nm or larger and 5 nm or smaller. Al contained in the inner surface protection layer 150 is preferable from viewpoints of suppressing propagation of defects and preventing mass transport at high temperatures. As shown in FIG. 8B, in the present embodiment, the inner surface protection layer 150 is formed between the n-type nanowire layer 140 and the active layer 160.

The active layer 160 is a semiconductor layer grown on an outermore side than the n-type nanowire layer 140, and a multiple quantum well active layer where a $Ga_{0.85}In_{0.15}N$ quantum well layer having a thickness of 5 nm and a GaN barrier layer having a thickness of 10 nm are overlapped for five periods may be exemplified. Herein, the multiple quantum well active layer is exemplified but a single quantum well structure or a bulk active layer is also possible. Since the active layer 160 is formed on a side surface and an upper surface of the n-type nanowire layer 140, it is possible to secure an area of the active layer 160.

The p-type semiconductor layer 170 is a semiconductor layer grown on an outermore side than the active layer 160, and is formed of GaN doped with p-type impurities, for example. Since the p-type semiconductor layer 170 is formed on a side surface and an upper surface of the active layer 160, a double hetero structure is formed by the n-type nanowire layer 140, the active layer 160 and the p-type semiconductor layer 170, so that it is possible to favorably confine carriers in the active layer 160 and to improve a probability of radiative recombination.

The tunnel junction layer 180 is a semiconductor layer grown on an outermore side than the p-type semiconductor layer 170, and has, for example, a two-layer structure where a p+ layer heavily doped with p-type impurities on an inner side and an n+ layer heavily doped with n-type impurities on an outer side are sequentially grown. The p+ layer is a semiconductor layer heavily doped with p-type impurities, and, for example, GaN having a thickness of 5 nm and Mg concentration of $2\times10^{20}cm^{-3}$ may be used. For the n+ layer, for example, GaN having a thickness of 10 nm and Si concentration of $2\times10^{20}cm^{-3}$ may be used. Since a tunnel junction is formed by the p+ layer and the n+ layer, the two layers of the p+ layer and the n+ layer configure the tunnel junction layer 180 in the present embodiment.

The buried semiconductor layer 190 is a semiconductor layer formed to cover an upper surface and a side surface of the pillar-shaped semiconductor layer and to reach the mask 130. As shown in FIG. 8A, in the region where the anode electrodes 220 and 230 are formed, the buried semiconductor layer 190 covers the tunnel junction layer 180 above the pillar-shaped semiconductor layer. Above the pillar-shaped semiconductor layer in the region where the anode electrodes 220 and 230 are not formed, the buried semiconductor layer 190 and the tunnel junction layer 180 are removed to expose an upper part of the p-type semiconductor layer 170, and the buried semiconductor layer 190 is in contact with the side surface of the tunnel junction layer 180, as shown in FIGS. 8A-8B.

The cathode electrodes 200 and 210 are electrodes formed in the region where the foundation layer 120 is exposed, and have a structure where a metal material that makes ohmic contact with the outermost surface of the foundation layer 120 and a pad electrode are stacked. The anode electrodes 220 and 230 are electrodes formed on a part of the buried semiconductor layer 190, and have a structure where a metal material that makes ohmic contact with the outermost surface of the buried semiconductor layer 190 and a pad electrode are stacked. Also, although not shown in FIGS. 8A-8B, a well-known structure where the surface of the semiconductor light emitting device 100 is covered with a passivation film as necessary may also be applied.

When lengthening an emission wavelength of the semiconductor light emitting device 100, it is necessary to increase an InN mole fraction of the active layer 160. For example, when a diameter of a circumscribed circle of the n-type nanowire layer 140 is 300 nm, it is necessary to use a red active layer composition $Ga_{0.6}In_{0.4}N$. However, as the InN mole fraction increases, the compressive stress increases, so that misfit dislocations may be generated. In order to avoid this, a film thickness of the $Ga_{0.6}In_{0.4}N$ well layer may be reduced or GaInN may be used as the material for forming the n-type nanowire layer 140. Similarly, when shortening the wavelength of the semiconductor light emitting device 100, AlGaN may be used as the n-type nanowire layer 140 or the well layer and the barrier layer of the active layer 160 may be each changed to AlGaN having different compositions.

Figure 9A:
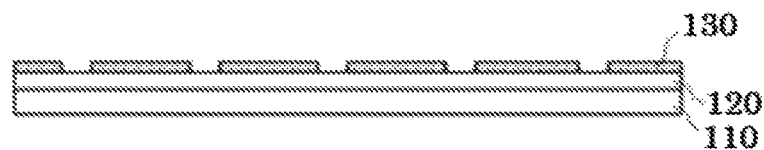
Figure 9B:
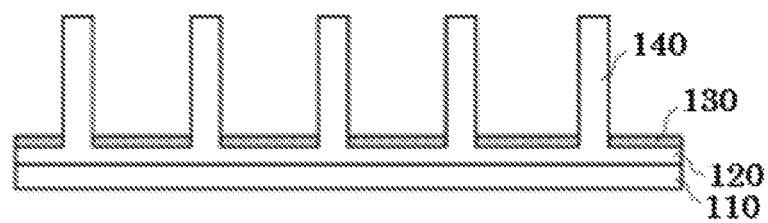
Figure 9C:
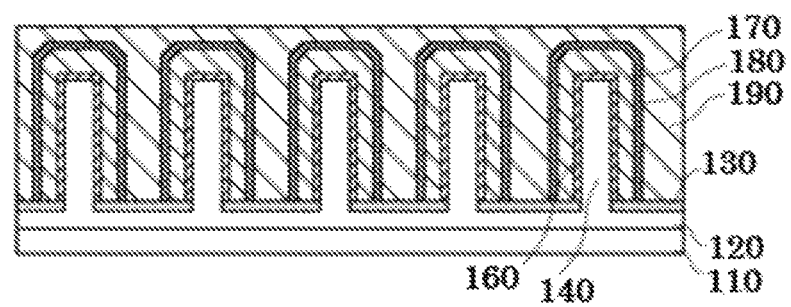
Figure 9D:
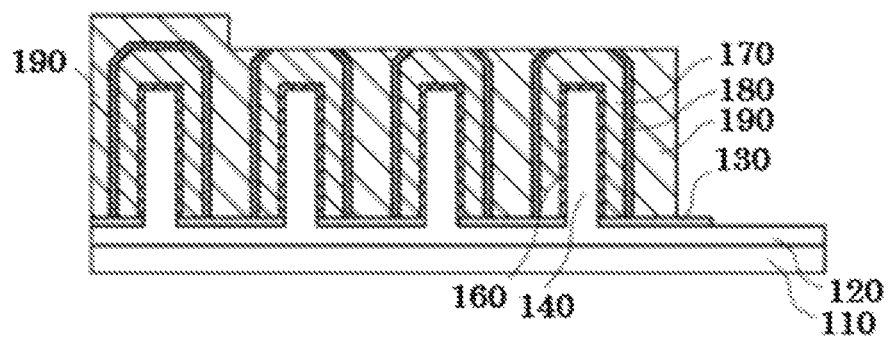
Figure 9E:
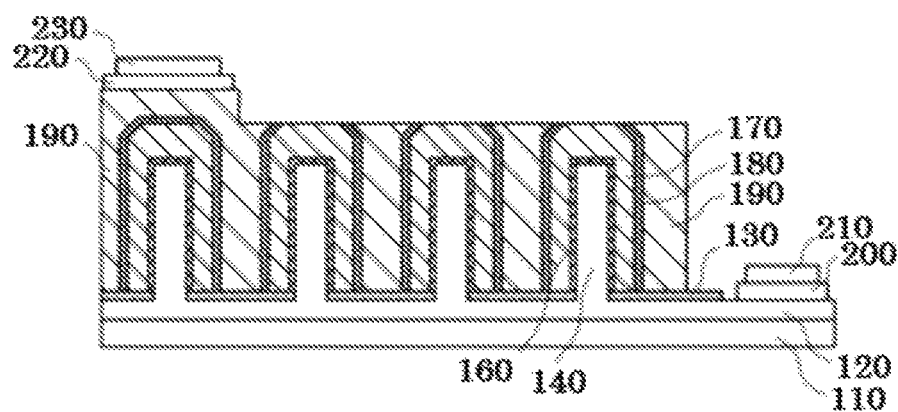

FIGS. 9A-9E are pictorial views depicting a manufacturing method of the semiconductor light emitting device 100, wherein FIG. 9A depicts a mask forming process, FIG. 9B depicts a nanowire growing process, FIG. 9C depicts a pillar-shaped semiconductor layer growing process, FIG. 9D depicts a removing process, and FIG. 9E depicts an electrode forming process.

In the mask process shown in FIG. 9A, the buffer layer made of AlN and the foundation layer 120 made of GaN and $Al_{0.05}Ga_{0.95}N$ are grown on the growth substrate 110 consisting of sapphire single crystal by using a metal organic chemical vapor deposition (MOCVD) method. Then, the mask 130 made of $SiO_2$ is deposited to have a film thickness of about 30 nm on the foundation layer 120 by a sputtering method, and the opening portions each having a diameter of about 150 nm are formed in the mask by using a fine pattern forming method such as nano-imprinting lithography. As growth conditions of the buffer layer, for example, TMA (TriMethylAluminum) and ammonia are used as a raw material gas, a growth temperature is 1100° C., a V/III ratio is 100, and a pressure is 10 hPa with hydrogen as a carrier gas. As growth conditions of the foundation layer 120 and the n-type semiconductor layer, for example, TMG (TriMethylGallium), TMA and ammonia are used as the raw material gas, the growth temperature is 1050° C., the V/III ratio is 1000, and the pressure is 500 hPa with hydrogen as the carrier gas.

Subsequently, in the nanowire growing process shown in FIG. 9B, the n-type nanowire layers 140 made of GaN are grown on the foundation layer 120 exposed from the opening portions by selective growth of the MOCVD method. As growth conditions of the n-type nanowire layer 140, for example, TMG, monosilane and ammonia are used as the raw material gas, the growth temperature is 1050° C., the V/III ratio is 20, and the pressure is 100 hPa with hydrogen as the carrier gas.

Subsequently, in the pillar-shaped semiconductor layer growing process in FIG. 9C, the MOCVD method is used to sequentially form the inner surface protection layer 150 (not shown in FIG. 9C to 9E) having a thickness of 1 to 100 nm and containing Al, the active layer 160 where a $Ga_{0.85}In_{0.15}N$ quantum well layer having a thickness of 5 nm and a GaN barrier layer having a thickness of 10 nm are overlapped for five periods, the p-type semiconductor layer 170 made of GaN doped with p-type impurities, and the tunnel junction layer 180 that includes the p+ layer made of GaN having a thickness of 5 nm and Mg concentration of $2\times10^{20}cm^{-3}$ and the n+ layer having a thickness of 10 nm and Si concentration of $2\times10^{20}cm^{-3}$, on the side surface and the upper surface of the n-type nanowire layer 140. Subsequently, the buried semiconductor layer 190 made of n-type GaN is grown to bury the outer periphery and the upper surface of the tunnel junction layer 180 in the buried semiconductor layer 190.

As growth conditions of the inner surface protection layer 150, for example, the growth temperature is 800° C., the V/III ratio is 3000, the pressure is 1000 hPa with nitrogen as the carrier gas, and TMG, TMA and ammonia are used as the raw material gas. As growth conditions of the active layer 160, for example, the growth temperature is 800° C., the V/III ratio is 3000, the pressure is 1000 hPa with nitrogen as the carrier gas, and TMG, TMI (TriMethylIndium) and ammonia are used as the raw material gas. As growth conditions of the p-type semiconductor layer 170, for example, the growth temperature is 950° C., the V/III ratio is 1000, the pressure is 300 hPa with hydrogen as the carrier gas, and TMG, Cp2Mg (bisCycropentadienylMagnesium) and ammonia are used as the raw material gas. As growth conditions of the tunnel junction layer 180, for example, the growth temperature is 800° C., the V/III ratio is 3000, the pressure is 500 hPa with nitrogen as the carrier gas, and TMG, Cp2Mg, monosilane and ammonia are used as the raw material gas. As growth conditions of the buried semiconductor layer 190, for example, the growth temperature is 900° C., the V/III ratio is 20, the pressure is 200 hPa with nitrogen as the carrier gas, and TMG, monosilane and ammonia are used as the raw material gas.

Subsequently, in the removing process shown in FIG. 9D, the upper surfaces of the buried semiconductor layer 190 and the tunnel junction layer 180 are removed selectively by dry etching to expose an upper surface of the p-type semiconductor layer 170. Also, in the region where the cathode electrodes 200 and 210 are to be formed, even the mask 130 is removed to expose an upper surface of the foundation layer 120.

Also, the activation process of performing annealing at 600° C. in an atmospheric environment in the state where the p-type semiconductor layer 170 is exposed, and releasing hydrogen incorporated in the p-type semiconductor layer 170 and the tunnel junction layer 180 to activate the p-type semiconductor layer 170 and the tunnel junction layer 180 is implemented. Herein, the annealing is performed in the atmospheric environment. However, an environment where atomic hydrogen capable of activating the p-type semiconductor layer 170 and the tunnel junction layer 180 does not exist is sufficient.

In the electrode forming process shown in FIG. 9E, the cathode electrodes 200 and 210 are formed on the surface of the foundation layer 120, and the anode electrodes 220 and 230 are formed on the buried semiconductor layer 190. Also, annealing after the electrode formation, formation of a passivation film and device division are implemented, as required, so that the semiconductor light emitting device 100 is obtained.

In the semiconductor light emitting device 100 of the present embodiment, when a voltage is applied between the cathode electrodes 200 and 210 and the anode electrodes 220 and 230, current flows in order of the buried semiconductor layer 190, the tunnel junction layer 180, the p-type semiconductor layer 170, the active layer 160, the inner surface protection layer 150, the n-type nanowire layer 140 and the n-type semiconductor layer, so that light is generated by radiative recombination in the active layer 160. The light emitted from the active layer 160 is extracted outside of the semiconductor light emitting device 100.

Figure 10A:
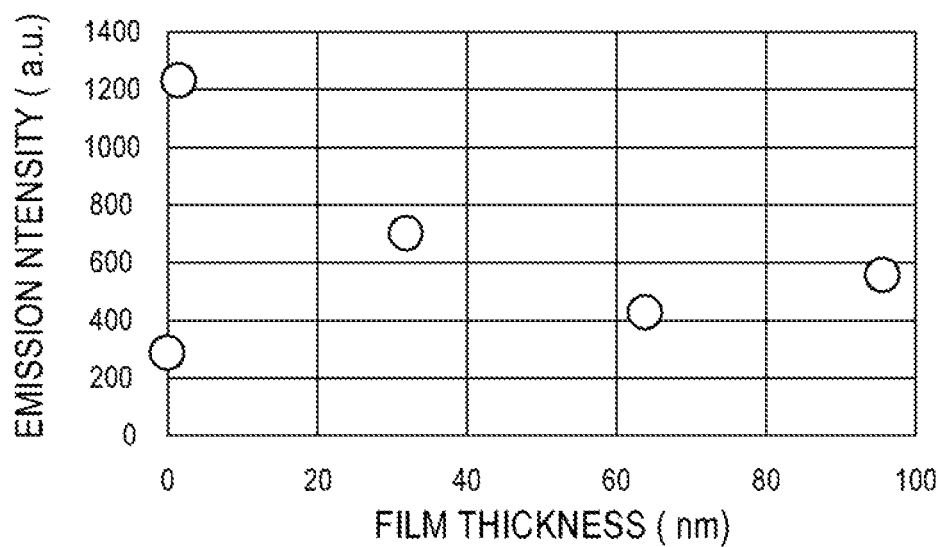
Figure 10B:
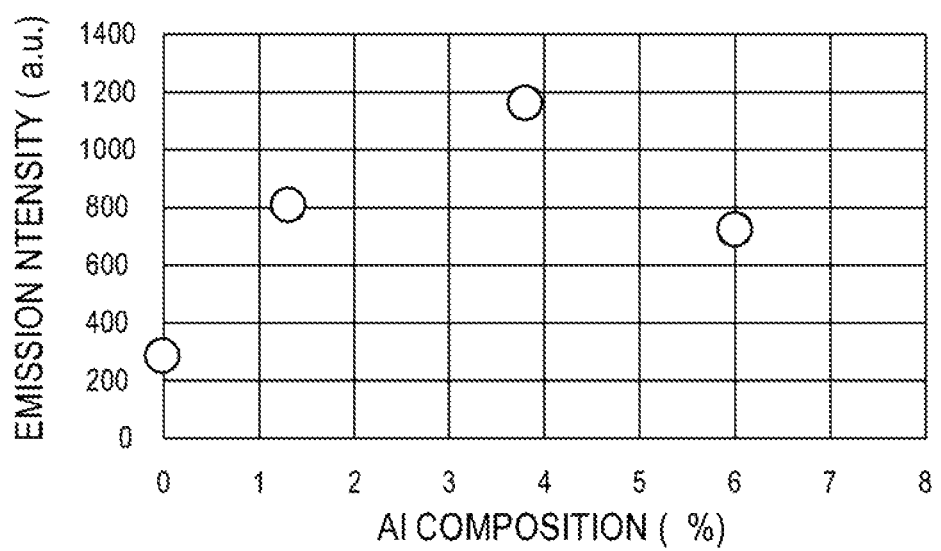

FIG. 10A shows a relation between a film thickness of the inner surface protection layer 150 and the emission intensity, and FIG. 10B shows a relation between an Al composition ratio of the inner surface protection layer 150 and the emission intensity. In the graph shown in FIG. 10A, AlGaN having an Al composition ratio of 0.06 is used as the inner surface protection layer 150, and in the graph shown in FIG. 10B, AlGaN is used as the inner surface protection layer 150, so that a film thickness of 30 nm is formed. Therefore, the film thickness of 0 nm in FIG. 10A and the Al composition ratio of 0% in FIG. 10B show a comparative example where the inner surface protection layer 150 is not provided.

As shown in FIG. 10A, even when the film thickness of the inner surface protection layer 150 is equal to or greater than 60 nm, the emission intensity is greater and the external quantum efficiency is higher than the case where the inner surface protection layer 150 is not provided. It is believed that this is because the point defects generated in the n-type nanowire layer 140 are reduced by the inner surface protection layer 150 and the crystal quality of the active layer 160 is thus improved. The emission intensity is maximized when the film thickness of the inner surface protection layer 150 is 1 nm, and the emission intensity is lowered as the film thickness increases. When the film thickness of the inner surface protection layer 150 is smaller than 1 nm, it is difficult to form the inner surface protection layer 150 on the entire side surface of the n-type nanowire layer 140, which is not preferable. Also, since the emission intensity is lowered as the film thickness increases, the film thickness is preferably 30 nm or smaller, and more preferably 5 nm or smaller.

As shown in FIG. 10B, when AlGaN is used as the inner surface protection layer 150, the emission intensity is greater and the external quantum efficiency is higher than the case where the Al composition ratio is 0 and the inner surface protection layer 150 is not provided. The emission intensity is maximized at the Al composition ratio of about 4%, and the emission intensity decreases at the composition ratios greater than 4%. When the Al composition ratio of the inner surface protection layer 150 is greater than 0, the emission intensity is improved. However, the range of 6% or less including Al is preferable because the emission intensity is further improved.

As shown in FIGS. 10A and 10B, in the semiconductor light emitting device 100 of the present embodiment, since the inner surface protection layer 150 is formed between the n-type nanowire layer 140 and the active layer 160, the point defects generated in the n-type nanowire layer 140 are suppressed from propagating to the active layer 160, so that the crystal quality of the active layer 160 is improved to improve the external quantum efficiency.

Also, in the semiconductor light emitting device 100 of the present embodiment, the active layer 160 is formed on the outermore side than the n-type nanowire layer 140, and the tunnel junction layer 180 is formed on the outer periphery of the active layer and is buried in the buried semiconductor layer 190. Therefore, current injected from the anode electrodes 220 and 230 is injected from a sidewall of the p-type semiconductor layer 170 into the active layer 160 via the tunnel junction layer 180 from the buried semiconductor layer 190, as tunneling current. Also, in the upper part of the pillar-shaped semiconductor layer, a reverse bias is applied to the upper surface of the p-type semiconductor layer 170 in contact with the n-type buried semiconductor layer 190, so that the current injection does not occur. The current injection by the tunneling current through the tunnel junction layer 180 has a low resistance, so that it is possible to favorably perform the current injection. Also, the current can diffuse more easily in the buried semiconductor layer 190, which is the n-type semiconductor layer, than the p-type semiconductor layer. Therefore, the current can be favorably diffused to the vicinity of the bottom surface on the side surface of the pillar-shaped semiconductor layer, so that the current can be injected from the entire tunnel junction layer 180.

Thereby, the current injected from the anode electrodes 220 and 230 is favorably injected into the p-type semiconductor layer 170 from the entire side surface of the pillar-shaped semiconductor layer, not the upper surface of the pillar-shaped semiconductor layer, and the current is favorably injected into the active layer 160, so that the high current density is implemented and the external quantum efficiency is improved.

Also, since the side surface of the n-type nanowire layer 140 is the m-plane formed by the selective growth, the active layer 160 and the p-type semiconductor layer 170 formed on the outer periphery of the n-type nanowire layer are also in contact with each other on the m-plane. Since the m-plane is a non-polar plane and polarization does not occur, the luminous efficiency is also high in the active layer 160. Also, since all the side surfaces of the hexagonal pillar are the m-planes, it is possible to improve the luminous efficiency of the semiconductor light emitting device 100. Also, when a height of the pillar-shaped semiconductor layer is increased to 500 nm or greater, a volume of the active layer 160 can be increased by three to ten times, as compared to a semiconductor light emitting device of the related art. As a result, it is possible to reduce an injected carrier density, thereby considerably reducing efficiency droop.

Also, since the buried semiconductor layer 190 is formed of the material whose bandgap is greater than that of the active layer 160, it is possible to remarkably reduce the light absorption in the buried semiconductor layer 190, as compared to a configuration where the current is injected into the pillar-shaped semiconductor layer at ITO or the like. Thereby, the light generated from the active layer 160 is suppressed from being absorbed in the semiconductor light emitting device 100, so that it is possible to improve the external quantum efficiency of extracting light outside of the semiconductor light emitting device 100.

As described above, in the semiconductor light emitting device 100 and the manufacturing method thereof in accordance with the present embodiment, since the inner surface protection layer 150 is provided in contact with the n-type nanowire layer 140 and the inner surface protection layer 150 is formed of the nitride semiconductor material containing Al, it is possible to suppress the point defects generated in the n-type nanowire layer 140 from propagating to the active layer 160, thereby improving the crystal quality of the active layer 160 and the external quantum efficiency.

Seventh Embodiment

Figure 11:
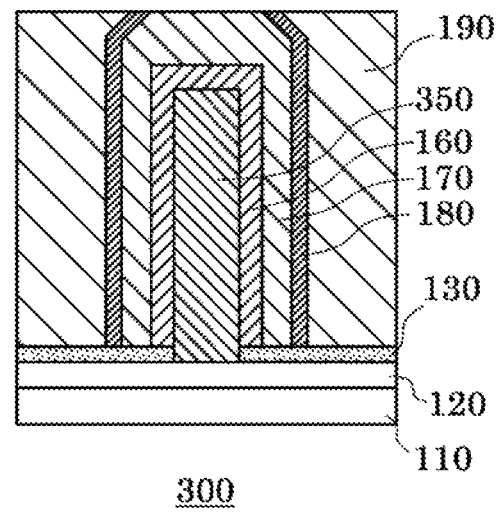
FIG. 11 is a pictorial enlarged view of a structure of a pillar-shaped semiconductor layer part of a semiconductor light emitting device 300 in accordance with a seventh embodiment.

Subsequently, a seventh embodiment of the present embodiment is described with reference to FIG. 11. The descriptions of the contents overlapping the sixth embodiment are omitted. FIG. 11 is a pictorial enlarged view depicting a structure of a pillar-shaped semiconductor layer part of a semiconductor light emitting device 300 in accordance with the seventh embodiment. The present embodiment is different from the sixth embodiment, in that an inner surface protection layer 350 is formed to have a nanowire shape, instead of forming the n-type nanowire layer 140 with GaN.

As shown in FIG. 11, the semiconductor light emitting device 300 of the present embodiment includes the growth substrate 110, the foundation layer 120, the mask 130, an inner surface protection layer 350, the active layer 160, the p-type semiconductor layer 170, the tunnel junction layer 180, and the buried semiconductor layer 190. In the present embodiment, the active layer 160 is formed on an outer periphery of the inner surface protection layer 350, the p-type semiconductor layer 170 is formed on the outermore side than the active layer 160, and the tunnel junction layer 180 is formed on the outermore side than the p-type semiconductor layer 170, so that a pillar shape is formed and a pillar-shaped semiconductor layer is thus configured.

The inner surface protection layer 350 is a pillar-shaped semiconductor layer selectively grown on the foundation layer 120 exposed from the opening portion of the mask 130, and is formed of a nitride semiconductor material containing Al doped with n-type impurities. The inner surface protection layer 350 contains at least Al, and a maximum composition ratio of Al is preferably 0.06 mol % or less.

For formation of the inner surface protection layer 350, AlGaN is selectively grown on the foundation layer 120 exposed from the opening portion of the mask 130, instead of the nanowire growing process shown in FIG. 9B of the sixth embodiment. As growth conditions of the inner surface protection layer 350, for example, TMG, TMA and ammonia are used as the raw material gas, the growth temperature is 1050° C., the V/III ratio is 20, and the pressure is 100 hPa with hydrogen as the carrier gas.

In the semiconductor light emitting device 300 of the present embodiment, instead of the n-type nanowire layer 140, the inner surface protection layer 350 is formed of the nitride semiconductor material containing Al. However, the nanowire-shaped inner surface protection layer 350 suppresses the point defects, which are generated when selectively growing a semiconductor layer on the foundation layer 120 from the opening portion of the mask 130, from propagating to the active layer 160, so that it is possible to improve the quality of the active layer 160 and the external quantum efficiency.

Eighth Embodiment

Figure 12:
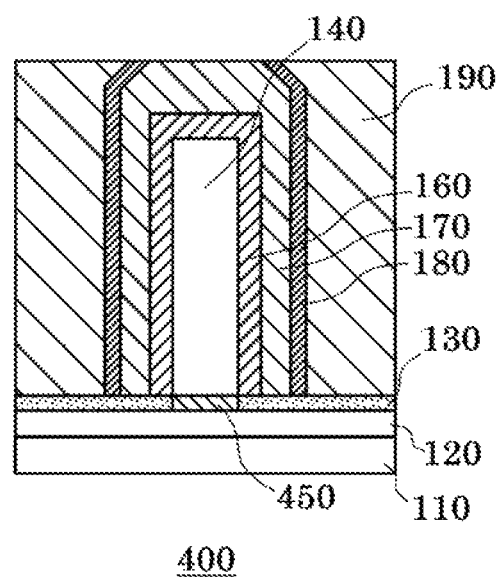
FIG. 12 is a pictorial enlarged view of a structure of a pillar-shaped semiconductor layer part of a semiconductor light emitting device 400 in accordance with an eighth embodiment.

Subsequently, an eighth embodiment of the present embodiment is described with reference to FIG. 12. The descriptions of the contents overlapping the sixth embodiment are omitted. FIG. 12 is a pictorial enlarged view depicting a structure of a pillar-shaped semiconductor layer part of a semiconductor light emitting device 400 in accordance with the eighth embodiment. The present embodiment is different from the sixth embodiment, in that an inner surface protection layer 450 is provided on a bottom part of the n-type nanowire layer 140.

As shown in FIG. 12, the semiconductor light emitting device 400 of the present embodiment includes the growth substrate 110, the foundation layer 120, the mask 130, an inner surface protection layer 450, the n-type nanowire layer 140, the active layer 160, the p-type semiconductor layer 170, the tunnel junction layer 180, and the buried semiconductor layer 190. In the present embodiment, the inner surface protection layer 450 is formed on a bottom part of the n-type nanowire layer 140 and is in contact with the n-type nanowire layer 140, the active layer 160 is formed on the outermore side than the n-type nanowire layer 140, the p-type semiconductor layer 170 is formed on the outermore side than the active layer 160, and the tunnel junction layer 180 is formed on the outermore side than the p-type semiconductor layer 170, so that a pillar shape is formed and a pillar-shaped semiconductor layer is thus configured.

The inner surface protection layer 450 is a semiconductor layer selectively grown on the foundation layer 120 exposed from the opening portion of the mask 130, and is formed of a nitride semiconductor material containing Al doped with n-type impurities. A composition ratio of Al contained in the inner surface protection layer 350 is preferably greater than 0 and equal to or less than 0.06. Also, a film thickness of the inner surface protection layer 450 is preferably equal to or greater than 1 nm and equal to or smaller than 100 nm, and is more preferably equal to or greater than 1 nm and equal to or smaller than 5 nm.

For formation of the inner surface protection layer 450, AlGaN is selectively grown on the foundation layer 120 exposed from the opening portion of the mask 130, in the early stage of the nanowire growing process shown in FIG. 9B of the sixth embodiment. As growth conditions of the inner surface protection layer 450, for example, TMG, TMA and ammonia are used as the raw material gas, the growth temperature is 1050° C., the V/III ratio is 20, and the pressure is 100 hPa with hydrogen as the carrier gas.

After forming the inner surface protection layer 450, the supply of TMA that is the raw material gas is stopped and TMG and ammonia are continuously supplied, so that the n-type nanowire layer 140 made of GaN can be formed to have a pillar shape on the inner surface protection layer 450, similarly to the sixth embodiment.

In the semiconductor light emitting device 400 of the present embodiment, the inner surface protection layer 450 is in contact with the n-type nanowire layer 140 and the inner surface protection layer 450 is provided between the foundation layer 120 and the n-type nanowire layer 140. Therefore, since the inner surface protection layer 450 on the foundation layer 120 is formed of the nitride semiconductor material containing Al, the point defects that are generated during the selective growth are suppressed and the defects propagating to the n-type nanowire layer 140 and the active layer 160 are reduced, so that it is possible to improve the crystal quality of the active layer 160 and the external quantum efficiency.

Ninth Embodiment

Figure 13:
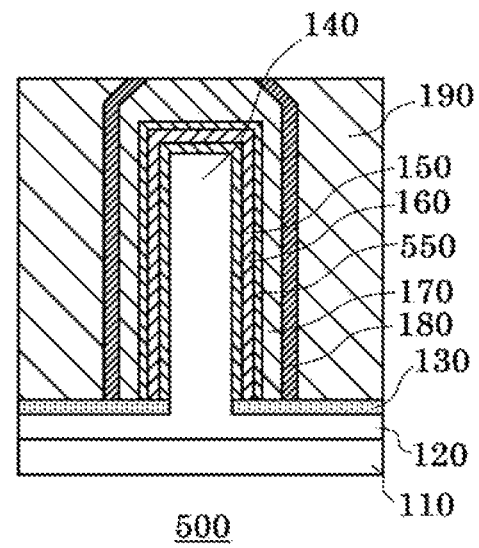
FIG. 13 is a pictorial enlarged view of a structure of a pillar-shaped semiconductor layer part of a semiconductor light emitting device 500 in accordance with a ninth embodiment.

Subsequently, a ninth embodiment of the present embodiment is described with reference to FIG. 13. The descriptions of the contents overlapping the sixth embodiment are omitted. FIG. 13 is a pictorial enlarged view depicting a structure of a pillar-shaped semiconductor layer part of a semiconductor light emitting device 500 in accordance with the ninth embodiment. The present embodiment is different from the sixth embodiment, in that an outer surface protection layer 550 is formed on the outer periphery of the active layer 160, in addition to providing the inner surface protection layer 150 on the inner side of the active layer 160.

As shown in FIG. 13, the semiconductor light emitting device 500 of the present embodiment includes the growth substrate 110, the foundation layer 120, the mask 130, the n-type nanowire layer 140, the inner surface protection layer 150, the active layer 160, an outer surface protection layer 550, the p-type semiconductor layer 170, the tunnel junction layer 180, and the buried semiconductor layer 190. In the present embodiment, the inner surface protection layer 150 is formed on the outer side than the n-type nanowire layer 140, the active layer 160 is formed on the outermore side than the inner surface protection layer 150, the outer surface protection layer 550 is formed on the outermore side than the active layer 160, the p-type semiconductor layer 170 is formed on the outermore side than the outer surface protection layer 550, and the tunnel junction layer 180 is formed on the outermore side than the p-type semiconductor layer 170, so that a pillar shape is formed and a pillar-shaped semiconductor layer is thus configured.

The outer surface protection layer 550 is a semiconductor layer formed in contact with the side surface and the upper surface of the active layer 160 and covering the outer periphery thereof, and is formed of a nitride semiconductor material containing Al. When Al is contained in a very small amount in the outer surface protection layer 550, the thermal stability is enhanced, as compared to GaN not containing Al. Thereby, when subjecting the p-type semiconductor layer 170 to the crystal growth at relatively high temperatures in a post-process, it is possible to protect the active layer 160 provided on the inner side of the outer surface protection layer 550 and crystal-grown at relatively low temperatures, and to suppress deformation due to mass transport and diffusion of In contained in the well layer.

A composition ratio of Al contained in the outer surface protection layer 550 is preferably greater than 0 and equal to or less than 0.06. Also, a film thickness of the outer surface protection layer 550 is preferably equal to or greater than 1 nm and equal to or smaller than 30 nm, and is more preferably equal to or greater than 1 nm and equal to or smaller than 5 nm. The outer surface protection layer 550 may be a non-doped layer or a layer doped with p-type impurities such as Mg. As shown in FIG. 13, in the present embodiment, the inner surface protection layer 150 and the outer surface protection layer 550 are provided on the inner and outer sides of the active layer 160. Therefore, the composition ratios and the film thicknesses of the inner surface protection layer 150 and the outer surface protection layer 550 are preferably set substantially the same so that asymmetrical distortion is not applied to the active layer 160.

Also in the semiconductor light emitting device 500 of the present embodiment, the outer surface protection layer 150 is provided in contact with the n-type nanowire layer 140 and the outer surface protection layer 150 is formed of the nitride semiconductor material containing Al. Therefore, it is possible to suppress the point defects generated in the n-type nanowire layer 140 from propagating to the active layer 160, so that it is possible to improve the crystal quality of the active layer 160 and the external quantum efficiency.

Tenth Embodiment

Figure 14:
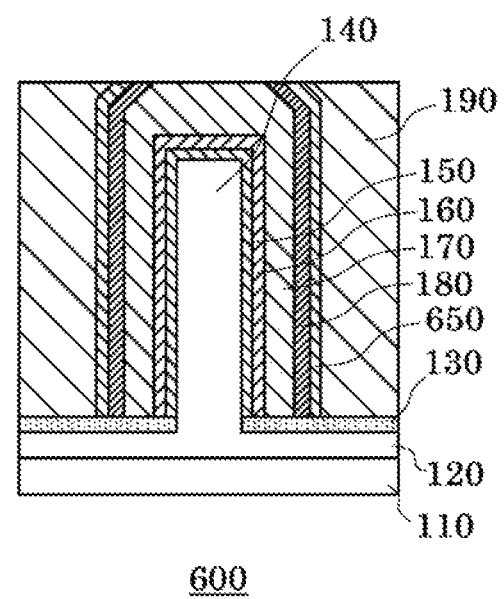
FIG. 14 is a pictorial enlarged view of a structure of a pillar-shaped semiconductor layer part of a semiconductor light emitting device 600 in accordance with a tenth embodiment.

Subsequently, a tenth embodiment of the present embodiment is described with reference to FIG. 14. The descriptions of the contents overlapping the sixth embodiment are omitted. FIG. 14 is a pictorial enlarged view depicting a structure of a pillar-shaped semiconductor layer part of a semiconductor light emitting device 600 in accordance with the tenth embodiment. The present embodiment is different from the sixth embodiment, in that an outer surface protection layer 650 is formed on the outer periphery of the tunnel junction layer 180, in addition to providing the inner surface protection layer 150 on the inner side of the active layer 160.

As shown in FIG. 14, the semiconductor light emitting device 600 of the present embodiment includes the growth substrate 110, the foundation layer 120, the mask 130, the n-type nanowire layer 140, the inner surface protection layer 150, the active layer 160, the p-type semiconductor layer 170, the tunnel junction layer 180, an outer surface protection layer 650, and the buried semiconductor layer 190. In the present embodiment, the inner surface protection layer 150 is formed on the outermore side than the n-type nanowire layer 140, the active layer 160 is formed on the outermore side than the inner surface protection layer 150, the p-type semiconductor layer 170 is formed on the outermore side than the active layer 160, the tunnel junction layer 180 is formed on the outermore side than the p-type semiconductor layer 170, and the outer surface protection layer 650 is formed on the outermore side than the tunnel junction layer 180, so that a pillar shape is formed and a pillar-shaped semiconductor layer is thus configured.

The outer surface protection layer 650 is a semiconductor layer formed in contact with the side surface and the upper surface of the tunnel junction layer 180 and covering the outer periphery thereof, and is formed of a nitride semiconductor material containing Al. When Al is contained in a very small amount in the outer surface protection layer 650, the thermal stability is enhanced, as compared to GaN not containing Al. Thereby, when subjecting the buried semiconductor layer 190 to the crystal growth at relatively high temperatures in a post-process, it is possible to protect the active layer 160, the p-type semiconductor layer 170 and the tunnel junction layer 180 crystal-grown on the inner side of the outer surface protection layer 650, and to suppress p-type impurities such as Mg doped in the p-type semiconductor layer 170 from diffusing into the buried semiconductor layer 190.

A composition ratio of Al contained in the outer surface protection layer 650 is preferably equal to or less than 0.06 including Al. Also, a film thickness of the outer surface protection layer 650 is preferably equal to or greater than 1 nm and equal to or smaller than 30 nm, and is more preferably equal to or greater than 1 nm and equal to or smaller than 5 nm. The outer surface protection layer 550 may be a non-doped layer or a layer doped with n-type impurities such as Si.

Also in the semiconductor light emitting device 600 of the present embodiment, the inner surface protection layer 150 is provided in contact with the n-type nanowire layer 140 and the inner surface protection layer 150 is formed of the nitride semiconductor material containing Al. Therefore, it is possible to suppress the point defects generated in the n-type nanowire layer 140 from propagating to the active layer 160, so that it is possible to improve the crystal quality of the active layer 160 and the external quantum efficiency.

The technical scope of the present embodiment is not limited to the above embodiments and can be diversely changed based on contents defined in the claims. The embodiments obtained by combining appropriately the technical means disclosed in different embodiments are also included in the technical scope of the present embodiment.

What is claimed is:

1. A semiconductor light emitting device comprising:
   a growth substrate;
   a pillar-shaped semiconductor layer formed on the growth substrate; and
   a buried semiconductor layer formed to cover the pillar-shaped semiconductor layer,
   wherein the pillar-shaped semiconductor layer has an n-type nanowire layer formed at a center, an active layer formed on an outermore side than the n-type nanowire layer, a p-type semiconductor layer formed on an outermore side than the active layer and a tunnel junction layer formed on an outermore side than the p-type semiconductor layer, and
   wherein at least a part of the pillar-shaped semiconductor layer is provided with a removed. region formed by removing from the buried semiconductor layer to apart of the tunnel junction layer.

2. The semiconductor light emitting device according to claim 1, wherein a plurality of the pillar-shaped semiconductor layers is provided, and the removed region is provided over the plurality of pillar-shaped semiconductor layers.

3. The semiconductor light emitting device according to claim 1, wherein the removed region is removed to a part of the p-type semiconductor layer.

4. The semiconductor light emitting device according to claim 1, wherein the removed region is removed to a part of the active layer.

5. The semiconductor light emitting device according to claim 1, wherein the removed region is removed to a part of the n-type nanowire layer.

6. The semiconductor light emitting device according to claim 1, wherein an insulating film is formed on the removed region, and a transparent electrode is formed covering at least a part of the buried semiconductor layer and the removed region.

7. The semiconductor light emitting device according to claim 1, wherein a high-resistance layer is formed on a top part of the n-type nanowire layer.

8. A growth method of a semiconductor light emitting device, the growth method comprising:
   a mask process of forming a mask layer having an opening portion on a growth substrate;
   a growth process of forming a pillar-shaped semiconductor layer in the opening portion by using selective growth; and
   a burying process of growing a buried semiconductor layer on the growth substrate so as to cover the pillar-shaped semiconductor layer,
   wherein the growth process comprises a process of forming an n-type nanowire layer, a process of forming an active layer on an outermore side than the n-type nanowire layer, a process of forming a p-type semiconductor layer on an outermore side than the active layer, and a process of forming a tunnel junction layer on an outermore side than the p-type semiconductor layer, and
   wherein the growth method comprises:
   a removing process of forming at least a part of the pillar-shaped semiconductor layer with a removed region by removing from the buried semiconductor layer to a part of the tunnel junction layer, after the burying process, and
   an activation process of annealing the p-type semiconductor layer after the removing process.

9. A semiconductor light emitting device comprising:
   a growth substrate; and
   a pillar-shaped semiconductor layer formed on the growth substrate,
   wherein the pillar-shaped semiconductor layer has an n-type nanowire layer formed at a center, an active layer formed on an outermore side than the n-type nanowire layer, and a p-type semiconductor layer formed on an outermore side than the active layer, and
wherein an inner surface protection layer made of a nitride semiconductor material containing Al is provided on a further n-side than the active layer.

10. The semicmductor light emitting device according to claim 9, wherein the inner surface protection layer is provided covering an outer periphery of the n-type nanowire layer and in contact with the active laver.

11. The semiconductor light emitting device according to claim 9, wherein at least Al is contained in the inner surface protection layer, and a maximum composition ratio of Al is 0.06 mol % or less.

12. The semiconductor light emitting device according to claim 9, wherein a film thickness of the inner surface protection layer is equal to or greater than 1 nm and equal to or smaller than 100 nm.

13. A semiconductor light emitting device comprising:
a growth substrate; and
a pillar-shaped semiconductor layer formed on the growth substrate,
wherein the pillar-shaped semiconductor layer has an n-type nanowire layer formed at a center, an active layer fonned on an outermore side than the n-type nanowire layer, and a p-type semiconductor layer formed on an outermore side than the active layer, and
wherein an outer surface protection layer made of a nitride semiconductor material containing Al is provided covering an outer periphery of the active layer.

14. A semiconductor light emitting device comprising:
a growth substrate; and
a pillar-shaped semiconductor layer formed on the growth substrate,
wherein the pillar-shaped semiconductor layer has an n-type nanowire layer formed at a center, an active layer fanned on an outermore side than the n-type nanowire layer, and a p-type semiconductor layer formed on an outermore side than the active layer, and
wherein an outer surface protection layer made of a nitride semiconductor material containing Al is provided covering an outer periphery of a tunnel junction layer.

15. The semiconductor light emitting device according to claim 9, wherein the inner surface protection layer is provided on a bottom part of the n-type nanowire layer.

16. The semiconductor light emitting device according to claim 9, further comprising a buried semiconductor layer formed to cover the pillar-shaped semiconductor layer.

17. The semiconductor fight emitting device according to claim 9, wherein a tunnel junction layer is formed on an outermore side than the p-type semiconductor layer.

18. A growth method of a semiconductor light emitting device comprising:
a mask process of forming a mask layer having an opening portion on a growth substrate; and
a growth process of forming a pillar-shaped semiconductor layer in the opening portion by using selective growth,
wherein the growth process comprises:
a process of forming an n-type nanowire layer,
a process of forming an active layer on an outermore side than the n-type nanowire layer,
a process of forming an inner surface protection layer in contact with lower sides of the n-type nanowire layer and the active layer, the inner surface protection layer being made of a nitride semiconductor material containing Al, and
a process of forming a p-type semiconductor layer on an outermoreside than the active layer.

* * * * *